United States Patent
Kim

(10) Patent No.: US 11,614,897 B2
(45) Date of Patent: Mar. 28, 2023

(54) STORAGE DEVICE AND OPERATING METHOD THEREOF

(71) Applicant: SK hynix Inc., Gyeonggi-do (KR)

(72) Inventor: Kwang Su Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/399,384

(22) Filed: Aug. 11, 2021

(65) Prior Publication Data

US 2022/0269441 A1 Aug. 25, 2022

(30) Foreign Application Priority Data

Feb. 24, 2021 (KR) ........................ 10-2021-0024972

(51) Int. Cl.
*G06F 3/06* (2006.01)

(52) U.S. Cl.
CPC ............ *G06F 3/0659* (2013.01); *G06F 3/064* (2013.01); *G06F 3/0604* (2013.01); *G06F 3/0679* (2013.01)

(58) Field of Classification Search
CPC ...... G06F 3/0659; G06F 3/0604; G06F 3/064; G06F 3/0679
See application file for complete search history.

(56) References Cited

U.S. PATENT DOCUMENTS

| | | | |
|---|---|---|---|
| 2012/0096217 A1* | 4/2012 | Son | G06F 12/0246 711/E12.008 |
| 2017/0132074 A1* | 5/2017 | Zhang | G06F 11/1068 |
| 2017/0255550 A1* | 9/2017 | Kim | G06F 3/0608 |
| 2018/0018091 A1* | 1/2018 | Shin | G06F 12/0246 |
| 2018/0068731 A1* | 3/2018 | Kim | G11C 16/3459 |
| 2018/0151251 A1* | 5/2018 | Oh | G06F 3/064 |
| 2019/0179698 A1* | 6/2019 | Liu | G06F 3/0614 |
| 2019/0179741 A1* | 6/2019 | Liu | G06F 3/0688 |
| 2020/0174702 A1* | 6/2020 | Byun | G06F 3/0652 |
| 2021/0303424 A1* | 9/2021 | Jain | G06F 3/0679 |

FOREIGN PATENT DOCUMENTS

| | | |
|---|---|---|
| KR | 10-2012-0098068 A | 9/2012 |
| KR | 10-2018-0009430 A | 1/2018 |
| KR | 10-2018-0060524 A | 6/2018 |
| KR | 10-2018-0137704 A | 12/2018 |

OTHER PUBLICATIONS

Office Action for the Korean Patent Application No. 10-2021-0024972 issued by the Korean Intellectual Property Office dated Dec. 20, 2022.

* cited by examiner

*Primary Examiner* — Francisco A Grullon
(74) *Attorney, Agent, or Firm* — IP & T Group LLP

(57) ABSTRACT

The present disclosure relates to an electronic device. According to the present disclosure, a storage device includes a memory controller acquiring a valid address reflecting a bad block more quickly and a plurality of memory devices each including a plurality of memory blocks included in each of a plurality of planes.

20 Claims, 17 Drawing Sheets

FIG. 6

Bad Block Information

| SB# | Channel 0 (DIE 0) | | | | Channel 0 (DIE 1) | | | | Channel 0 (DIE 2) | | | | Channel 0 (DIE 3) | | | |
| --- | --- | --- | --- | --- | --- | --- | --- | --- | --- | --- | --- | --- | --- | --- | --- | --- |
| | P0 | P1 | P2 | P3 | P0 | P1 | P2 | P3 | P0 | P1 | P2 | P3 | P0 | P1 | P2 | P3 |
| 0 | 0 | 0 | 0 | 0 | 0 | 0 | 0 | 0 | 0 | 0 | 0 | 0 | 0 | 0 | 0 | 0 |
| 1 | 1 | 1 | 1 | 1 | 1 | 1 | 1 | 1 | 1 | 1 | 1 | 1 | 1 | 1 | 1 | 1 |
| 2 | 2 | 2 | 2 | 2 | 2 | 2 | 2 | 2 | 2 | 2 | 2 | 2 | 2 | 2 | 2 | 2 |
| 3 | 3 | 3 | 3 | 3 | 3 | 3 | 3 | 3 | 3 | 3 | 3 | 3 | 3 | 3 | 3 | 3 |
| 4 | 4 | 4 | 4 | 4 | 4 | 4 | 4 | 4 | 4 | 4 | 4 | 4 | 4 | 4 | 4 | 4 |
| 5 | 5 | 5 | 5 | 5 | 5 | 5 | 5 | 5 | 5 | 5 | 5 | 5 | 5 | 5 | 5 | 5 |
| 6 | 6 | 6 | 6 | 6 | 6 | 6 | 6 | 6 | 6 | 6 | 6 | 6 | 6 | 6 | 6 | 6 |
| 7 | 7 | 7 | 7 | 7 | 7 | 7 | 7 | 7 | 7 | 7 | 7 | 7 | 7 | 7 | 7 | 7 |
| 8 | 8 | 8 | 8 | 8 | 8 | 8 | 8 | 8 | 8 | 8 | 8 | 8 | 8 | 8 | 8 | 8 |
| 9 | 9 | 9 | 9 | 9 | 9 | 9 | 9 | 9 | 9 | 9 | 9 | 9 | 9 | 9 | 9 | 9 |
| 10 | 10 | 10 | 10 | 10 | 10 | 10 | 10 | 10 | 10 | 10 | 10 | 10 | 10 | 10 | 10 | 10 |
| 11 | 11 | 11 | 11 | 11 | 11 | 11 | 11 | 11 | 11 | 11 | 11 | 11 | 11 | 11 | 11 | 11 |
| 12 | 12 | 12 | 12 | 12 | 12 | 12 | 12 | 12 | 12 | 12 | 12 | 12 | 12 | 12 | 12 | 12 |
| 13 | 13 | 13 | 13 | 13 | 13 | 13 | 13 | 13 | 13 | 13 | 13 | 13 | 13 | 13 | 13 | 13 |
| 14 | 14 | 14 | 14 | 14 | 14 | 14 | 14 | 14 | 14 | 14 | 14 | 14 | 14 | 14 | 14 | 14 |
| 15 | 15 | 15 | 15 | 15 | 15 | 15 | 15 | 15 | 15 | 15 | 15 | 15 | 15 | 15 | 15 | 15 |
| 16 | 16 | 16 | 16 | 16 | 16 | 16 | 16 | 16 | 16 | 16 | 16 | 16 | 16 | 16 | 16 | 16 |
| 17 | 17 | 17 | 17 | 17 | 17 | 17 | 17 | 17 | 17 | 17 | 17 | 17 | 17 | 17 | 17 | 17 |
| 18 | 18 | 18 | 18 | 18 | 18 | 18 | 18 | 18 | 18 | 18 | 18 | 18 | 18 | 18 | 18 | 18 |
| 19 | 19 | 19 | 19 | 19 | 19 | 19 | 19 | 19 | 19 | 19 | 19 | 19 | 19 | 19 | 19 | 19 |
| 20 | 20 | 20 | 20 | 20 | 20 | 20 | 20 | 20 | 20 | 20 | 20 | 20 | 20 | 20 | 20 | 20 |
| 21 | 21 | 21 | 21 | 21 | 21 | 21 | 21 | 21 | 21 | 21 | 21 | 21 | 21 | 21 | 21 | 21 |
| 22 | 22 | 22 | 22 | 22 | 22 | 22 | 22 | 22 | 22 | 22 | 22 | 22 | 22 | 22 | 22 | 22 |
| 23 | 23 | 23 | 23 | 23 | 23 | 23 | 23 | 23 | 23 | 23 | 23 | 23 | 23 | 23 | 23 | 23 |
| 24 | 24 | 24 | 24 | 24 | 24 | 24 | 24 | 24 | 24 | 24 | 24 | 24 | 24 | 24 | 24 | 24 |
| 25 | 25 | 25 | 25 | 25 | 25 | 25 | 25 | 25 | 25 | 25 | 25 | 25 | 25 | 25 | 25 | 25 |
| 26 | 26 | 26 | 26 | 26 | 26 | 26 | 26 | 26 | 26 | 26 | 26 | 26 | 26 | 26 | 26 | 26 |
| … | … | … | … | … | … | … | … | … | … | … | … | … | … | … | … | … |

☐ Bad Block

FIG. 7

SB Info Table

| SB# | Status Info |
|---|---|
| 0 | Paired |
| 1 | Paired |
| 2 | Paired |
| 3 | Victim |
| 4 | Unpaired |
| 5 | Paired |
| 6 | Unpaired |
| 7 | Unpaired |
| 8 | Paired |
| 9 | Paired |
| 10 | Unpaired |
| 11 | Paired |
| 12 | Paired |
| 13 | Paired |
| 14 | Unpaired |
| 15 | Paired |
| 16 | Victim |
| 17 | Unpaired |
| 18 | Paired |
| 19 | Paired |
| 20 | Unpaired |
| 21 | Unpaired |
| 22 | Unpaired |
| 23 | Paired |
| 24 | Victim |
| 25 | Paired |
| 26 | Victim |
| 27 | Paired |
| 28 | Paired |
| ⋮ | ⋮ |

FIG. 8

Replacement Block Table

| DIE | Victim SB | 3 | 16 | 24 | 26 | ... |
|---|---|---|---|---|---|---|
| DIE0 | P0 | 20 | X | X | X | ... |
| | O1 | X | X | X | X | ... |
| | P2 | X | X | X | X | ... |
| | P3 | 6 | X | X | X | ... |
| DIE1 | P0 | 17 | X | X | X | ... |
| | O1 | X | X | X | X | ... |
| | P2 | 22 | X | X | X | ... |
| | P3 | X | X | X | X | ... |
| DIE2 | P0 | X | X | X | X | ... |
| | O1 | X | X | X | X | ... |
| | P2 | X | X | X | X | ... |
| | P3 | X | X | X | X | ... |
| DIE3 | P0 | 14 | X | X | X | ... |
| | O1 | 26 | X | X | X | ... |
| | P2 | 4 | 7 | X | X | ... |
| | P3 | 10 | 21 | X | X | ... |

FIG. 9

STORAGE DEVICE AND OPERATING METHOD THEREOF

CROSS-REFERENCE TO RELATED APPLICATION

The present application claims priority under 35 U.S.C. § 119(a) to Korean patent application number 10-2021-0024972 filed on Feb. 24, 2021, the entire disclosure of which is incorporated by reference herein.

BACKGROUND

1. Technical Field

Various embodiments of the present disclosure relate generally to an electronic device, and more particularly, to a storage device and a method of operating the storage device.

2. Related Art

A storage device is configured to store data in response to control of a host device such as a computer or a smartphone. A storage device may include a memory device storing data and a memory controller controlling the memory device. Memory devices may be divided into volatile memory devices and non-volatile memory devices.

A volatile memory device may retain data as long as power is being supplied, and may lose the stored data in the absence of power supply. Types of volatile memory devices may include Static Random Access Memory (SRAM), Dynamic Random Access Memory (DRAM), and the like.

A non-volatile memory device may not lose data even in the absence of power supply. Types of the non-volatile memory devices may include Read Only Memory (ROM), Programmable ROM (PROM), Electrically Programmable ROM (EPROM), Electrically Erasable and Programmable ROM (EEPROM) and flash memory.

SUMMARY

Various embodiments of the present disclosure are directed to a storage device including a memory controller acquiring a valid address reflecting a bad block more quickly and a memory device, and a method of operating the storage device.

According to an embodiment of the present disclosure, a memory controller controlling a plurality of memory devices each including a plurality of memory blocks, wherein the plurality of memory blocks are included in each of a plurality of planes, the plurality of memory blocks are controlled in units of super blocks, each super block includes at least two memory blocks, the memory controller may include: an operation controller configured to generate a command for controlling the plurality of memory devices and to convert a logical address corresponding to the command into a virtual address for a super block among the super bocks; plane hash tables, for the plurality of planes respectively, for storing super block indices indicating super blocks which include a bad block among the super blocks and victim super block indices indicating victim super blocks among the super blocks, each of the victim super blocks includes a normal block to replace the bad block; a victim super block table for storing the victim super block indices corresponding to the victim super blocks among the super blocks; and a valid address translator configured to search the plane hash tables for a super block index corresponding to the virtual address for the super block by using a hash function, to translate the virtual address into a valid address being a physical address including no bad block according to a search result, and providing the command and the valid address to the plurality of memory devices.

According to an embodiment of the present disclosure, a memory controller controlling a plurality of memory devices each including a plurality of planes each including a plurality of memory blocks, the memory controller may include a valid address controller configured to convert, into a valid address, an address of a bad block included in a virtual address among the plurality of memory blocks by replacing the bad block with a normal block; and a valid address information generator configured to acquire bad block information from the plurality of memory devices, and to generate valid address information for converting the virtual address into the valid address by using the bad block information.

According to an embodiment of the present disclosure, a storage device may include a plurality of memory devices each including a plurality of planes each including a plurality of memory blocks, wherein the plurality of memory blocks are controlled in units of super blocks, each super block includes at least two memory blocks; a valid address information storage including: plane hash tables for the plurality of planes respectively, wherein each of the plane hash tables include a super block indices representing super blocks including a bad block of the plurality of planes, respectively and a victim super block index indicating a victim super block including a normal block to replace the bad block, and a victim super block table including a victim super block index corresponding to the victim super block index; and a memory controller configured to: receiving a request for instructing an operation to be performed and a logical address corresponding to the request from an external host, generating a command for the operation in response to the request, acquiring a virtual address corresponding to the logical address, wherein the virtual address is an address of memory block for the operation, searching the plane hash tables for the super block number indicated by the virtual address by using a hash function, acquiring, as a valid address, an address of the normal block included in the victim super block for replacing an address of the bad block included in the super block index indicated by the virtual address, according to a result of the search, and providing the command and the valid address to the plurality of memory devices.

According to an embodiment of the present disclosure A memory system comprising: a storage including first and second super blocks each having memory blocks selected from respective planes included in the storage; and a controller configured to: search, based on a first address indicating a first memory block within the first super block, first and second lists for a second address indicating a second memory block within the second super block, and control, according to the second address instead of the first address, the storage to access the second memory block instead of the first memory block, wherein the first list represents each of the planes and includes information on the first super block and an index indicating the second super block, and wherein the second list includes the index and information on the second super block.

BRIEF DESCRIPTION OF THE DRAWINGS

FIG. 6 is a diagram illustrating bad block information stored in each of a plurality of memory dies of FIG. 4 according to an embodiment of the present disclosure;

FIG. 7 is a diagram illustrating a super block information table of FIG. 5;

FIG. 8 is a diagram illustrating a replacement block table of FIG. 5;

FIG. 9 is a diagram illustrating a method of replacing a bad block with a normal block based on a replacement block table of FIG. 8 according to an embodiment of the present disclosure;

DETAILED DESCRIPTION

Specific structural or functional descriptions of examples of embodiments in accordance with concepts which are disclosed in this specification are illustrated only to describe the examples of embodiments in accordance with the concepts and the examples of embodiments in accordance with the concepts may be carried out by various forms but the descriptions are not limited to the examples of embodiments described in this specification.

The both terms of "index" and "number" may be used for identifying super blocks or memory blocks interchangeably through the specification.

Figure 1:
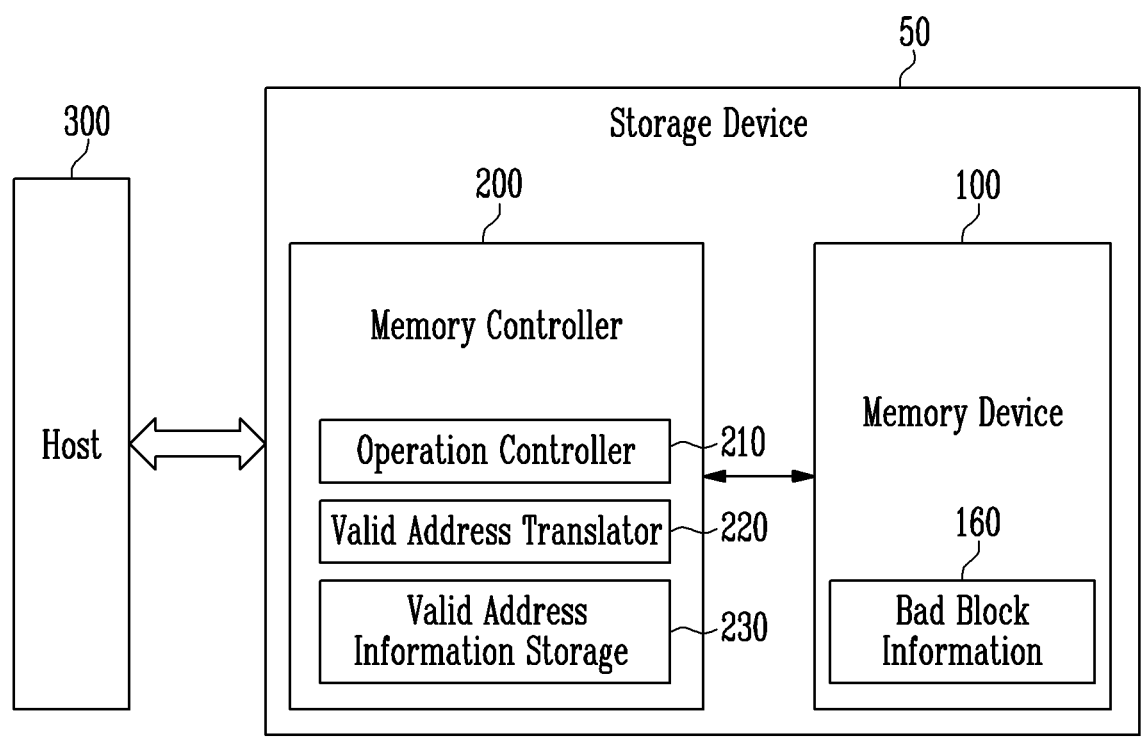
FIG. 1 is a block diagram illustrating a storage device according to an embodiment of the present disclosure.

FIG. 1 is a diagram illustrating a storage device 50 according to an embodiment of the present disclosure.

Referring to FIG. 1, the storage device 50 may include a memory device 100 and a memory controller 200. The storage device 50 may be configured to store data in response to control of a host 300. Examples of the storage device 50 may include a cellular phone, a smartphone, an MP3 player, a laptop computer, a desktop computer, a game player, a TV, a tablet PC, or an in-vehicle infotainment system. However, the storage device 50 may be configured to store data in response to control of the host 300 that stores high-capacity data in a location, such as a server or a data center.

The storage device 50 may be manufactured as one of various types of storage devices according to a host interface corresponding to a communication method with the host 300. For example, the storage device 50 may be configured as any of various kinds of storage devices such as a solid state drive (SSD), a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any of various types of packages. For example, the storage device 50 may be manufactured as any of various package types, such as a package-on-package (POP), a system-in-package (SIP), a system-on-chip (SOC), a multi-chip package (MCP), a chip-on-board (COB), a wafer-level fabricated package (WFP), a wafer-level stack package (WSP) and the like.

The memory device 100 may store data. The memory device 100 may operate in response to control of the memory controller 200. The memory device 100 may include a memory cell array (not shown) including a plurality of memory cells storing data.

Each of the memory cells may be configured as a Single Level Cell (SLC) storing one data bit, a Multi-Level Cell (MLC) storing two data bits, a Triple Level Cell (TLC) storing three data bits, or a Quad Level Cell (QLC) storing four data bits.

A memory cell array (not shown) may include a plurality of memory blocks. Each of the memory blocks may include a plurality of memory cells. Each of the memory blocks may include a plurality of pages. In an embodiment, the page may be a unit for storing data in the memory device 100 or reading data stored in the memory device 100. A memory block may be a unit for erasing data.

According to an embodiment, examples of the memory device 100 may include a Double Data Rate Synchronous Dynamic Random Access Memory (DDR SDRAM), a Low Power Double Data Rate4 (LPDDR4) SDRAM, a Graphics Double Data Rate (GDDR) SDRAM, a Low Power DDR (LPDDR) SDRAM, a Rambus Dynamic Random Access Memory (RDRAM), a NAND flash memory, a vertical NAND flash memory, a NOR flash memory device, a resistive random access memory (RRAM), a phase-change random access memory (PRAM), a magnetoresistive random access memory (MRAM), a ferroelectric random access memory (FRAM), or a spin transfer torque random access memory (STT-RAM). For convenience of description, the memory device 100 is a NAND flash memory which includes a plurality of dies.

The memory device 100 receives a command and an address from the memory controller 200 and accesses an area selected by the address in the memory cell array. The memory device 100 may perform an operation corresponding to the command on the area selected in response to the address. For example, the memory device 100 may perform a write (program) operation, a read operation, and an erase operation. During a program operation, the memory device 100 may program data into the area selected in response to the address. During a read operation, the memory device 100 may read data from the area selected by the address. During an erase operation, the memory device 100 may erase data from the area selected by the address.

The memory device 100 may include bad block information 160. The bad block information 160 may include information about a bad block which is a memory block in a defective state among a plurality of memory blocks. A bad block may refer to a memory block which is determined as being in a defective state during production and test processes, or a memory block which is determined as being in a defective state according to use of the memory device 100. Memory blocks which are identified as bad blocks during production and test processes may be referred to as initial bad blocks (IBB) or manufacture bad blocks (MBB). Memory blocks identified as bad blocks by use of the memory device 100 may be referred to as growing bad blocks (GBB). The use of the bad blocks should be prohibited because the bad blocks are defective. Therefore, when power is supplied, the memory device 100 may provide the bad block information 160 to the memory controller 200, and the memory controller 200 may access the memory device 100 according to the bad block information 160.

The bad block information 160 may be stored in a predetermined memory block among the plurality of memory blocks included in the memory device 100. The predetermined memory block may be a one-time programmable (OTP) block or a contents addressable memory (CAM) block.

The memory controller 200 may control general operations of the storage device 50.

When power is applied to the storage device 50, the memory controller 200 may execute firmware FW. When the memory device 100 is a flash memory device, the firmware FW may include a host interface layer (HIL) controlling communication with the host 300, a flash translation layer (FTL) controlling communication between the host 300 and the memory device 100, and a flash interface layer (FIL) controlling communication with the memory device 100.

The memory controller 200 may access the memory device 100 in response to a request of the host 300. The memory controller 200 accessing the memory device 100 may include storing data in the memory device 100, or reading data stored in the memory device 100.

More specifically, the memory controller 200 may control the memory device 100 to perform a program operation, a read operation, or an erase operation. During a program operation, the memory controller 200 may provide a program command, an address, and data to the memory device 100. During a read operation, the memory controller 200 may provide a read command and an address to the memory device 100. During an erase operation, the memory controller 200 may provide an erase command and an address to the memory device 100.

According to an embodiment, the memory controller 200 may generate and transfer a command, an address, and data to the memory device 100 regardless of a request from the host 300. For example, the memory controller 200 may provide the memory device 100 with commands, addresses and data for performing a program operation, a read operation and erase operations associated with performing wear leveling, read reclaim, and garbage collection.

The memory controller 200 may include an operation controller 210, a valid address translator 220 and a valid address information storage 230.

The operation controller 210 may control the general operations of the memory controller 200. The operation controller 210 may process a write request or a read request received from the host 300. Alternatively, the operation controller 210 may read data from the memory device 100, or may control the memory device 100 to store data in the memory device 100 regardless of a request from the host 300.

When the operation controller 210 processes the write request, the operation controller 210 may generate a program command and convert a logical address corresponding to data to be stored into a virtual address. A virtual address may be a physical address that indicates a location where data is stored in the memory device 100. A virtual address may be allocated with no consideration of a bad block on the assumption that none of the memory blocks of the memory device 100 are bad blocks. The operation controller 210 may provide the generated command and virtual address to the valid address translator 220.

To process a read request, the operation controller 210 may generate a read command and acquire a virtual address corresponding to a logical address to read from a logical-to-virtual mapping table. The operation controller 210 may provide the generated command and virtual address to the valid address translator 220.

The valid address translator 220 may translate the virtual address received from the operation controller 210 into a valid address. A valid address may refer to a physical address of a normal block or a replacement block for replacing a virtual address corresponding to a bad block of the memory device 100.

More specifically, when the memory block corresponding to the virtual address is a bad block, the valid address translator 220 may translate the virtual address into a valid address which indicates a normal block (replacement block) which is not a bad block.

According to an embodiment, a plurality of memory blocks which are included in the memory device 100 may be managed in units of super blocks. A super block may include a plurality of memory blocks. Memory blocks which are included in the same super block may be processed at the same time using an interleaving scheme or a multi-plane operation.

When a super block corresponding to a virtual address includes a bad block, the valid address translator 220 may translate the virtual address into a valid address for replacing the bad block included in the super block corresponding to the virtual address with a normal block (replacement block).

The valid address translator 220 may provide the command transferred from the operation controller 210 and the translated valid address to the memory device 100.

The valid address information storage 230 may include information about a valid address. According to an embodiment, the valid address translator 220 may translate the virtual address into a valid address using the information about the valid address which is stored in the valid address information storage 230. The valid address information that is stored in the valid address information storage 230 will be described below in more details with reference to FIGS. 5 to 12.

The operation controller 210 may be included in a flash translation layer (FTL) in firmware of the memory controller 200. The valid address translator 220 and the valid address information storage 230 may be included in a flash interface layer (FIL). According to an embodiment, the valid address information storage 230 may be included in a buffer memory in the memory controller 200.

The host 300 may communicate with the storage device 50 using at least one of various communication standards or interfaces such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

Figure 2:
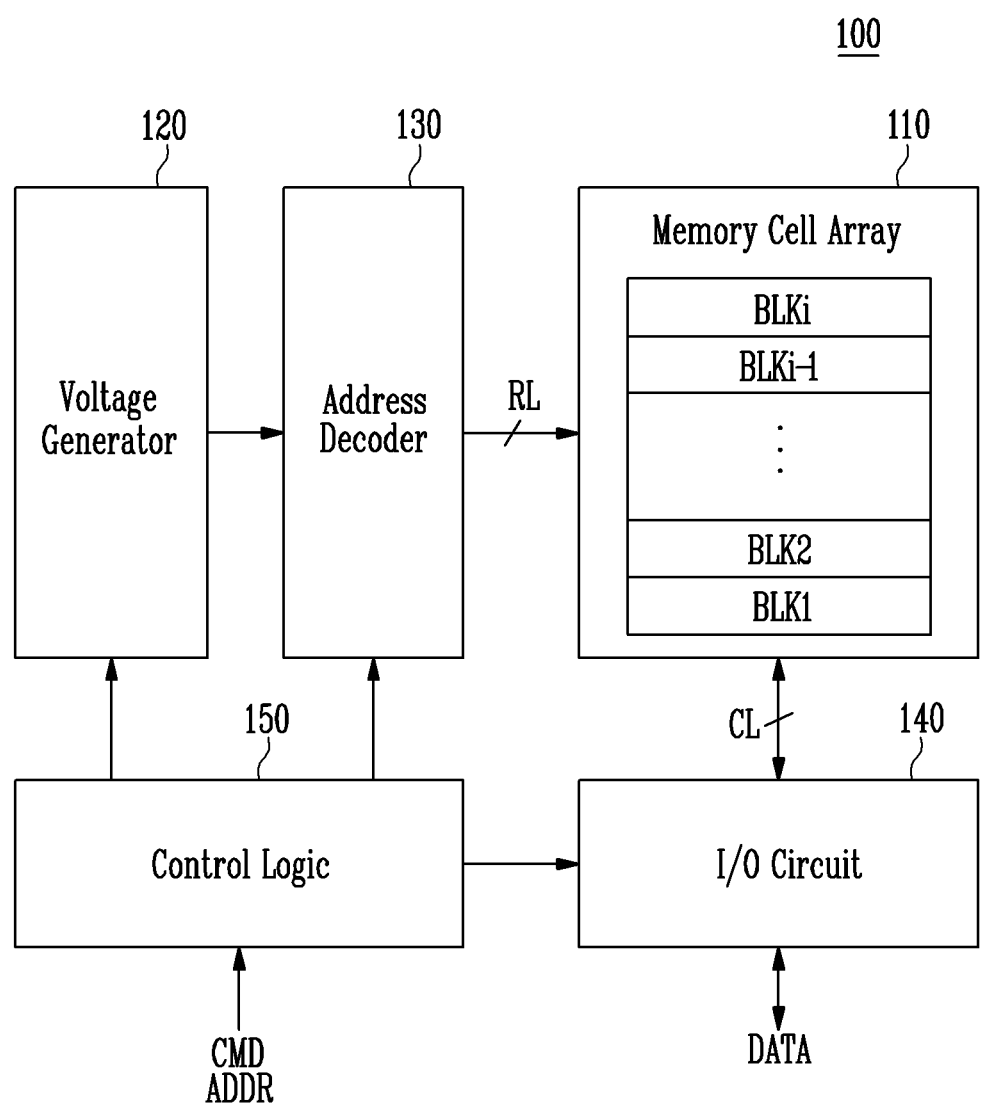
FIG. 2 is a block diagram illustrating a memory device shown in FIG. 1 according to an embodiment of the present disclosure.

FIG. 2 is a diagram illustrating the memory device 100 shown in FIG. 1 according to an embodiment of the present disclosure.

Referring to FIG. 2, the memory device 100 may include a memory cell array 110, a voltage generator 120, an address decoder 130, an input/output circuit 140, and a control logic 150.

The memory cell array 110 may include a plurality of memory blocks BLK1 to BLKi. The plurality of memory blocks BLK1 to BLKi may be coupled to the address decoder 130 through row lines RL. The plurality of memory blocks BLK1 to BLKi may be coupled to the input/output circuit 140 through column lines CL. According to an embodiment, the row lines RL may include word lines, source select lines and drain select lines. According to an embodiment, the column lines CL may include bit lines.

Each of the plurality of memory blocks BLK1 to BLKi may include a plurality of memory cells. According to an embodiment, the plurality of memory cells may be non-volatile memory cells. Memory cells coupled to the same word line, among the plurality of memory cells, may be defined as a single physical page. In other words, a memory block may include a plurality of physical pages. Each of the memory cells may be configured as a Single Level Cell (SLC) storing one data bit, a Multi-Level Cell (MLC) storing two data bits, a Triple Level Cell (TLC) storing three data bits, or a Quad Level Cell (QLC) storing four data bits.

According to an embodiment, the voltage generator 120, the address decoder 130 and the input/output circuit 140 may be collectively referred to as a peripheral circuit. The peripheral circuit may drive the memory cell array 110 in response to the control logic 150. The peripheral circuit may drive the memory cell array 110 to perform a program operation, a read operation and an erase operation.

The voltage generator 120 may be configured to generate a plurality of operating voltages by using an external power voltage supplied to the memory device 100. The voltage generator 120 may be controlled by the control logic 150.

According to an embodiment, the voltage generator 120 may generate an internal power voltage by regulating the external power voltage. The internal power voltage generated by the voltage generator 120 may serve as an operating voltage of the memory device 100.

According to an embodiment, the voltage generator 120 may generate a plurality of operating voltages by using the external power voltage or the internal power voltage. The voltage generator 120 may be configured to generate various voltages required by the memory device 100. For example, the voltage generator 120 may generate a plurality of erase voltages, a plurality of program voltages, a plurality of pass voltages, a plurality of selected read voltages, and a plurality of unselected read voltages.

The voltage generator 120 may include a plurality of pumping capacitors receiving the internal power voltage to generate a plurality of operating voltages having various voltage levels, and may generate a plurality of operating voltages by selectively activating the plurality of pumping capacitors in response to control of the control logic 150.

The generated operating voltages may be supplied to the memory cell array 110 by the address decoder 130.

The address decoder 130 may be coupled to the memory cell array 110 through the row lines RL. The address decoder 130 may be configured to operate in response to the control logic 150. The address decoder 130 may receive an address ADDR from the control logic 150. The address decoder 130 may be configured to decode a block address of the received address ADDR. The address decoder 130 may select at least one memory block among the memory blocks BLK1 to BLKi, according to the decoded block address. The address decoder 130 may be configured to decode a row address of the received address ADDR. The address decoder 130 may select at least one word line among word lines of a selected memory block according to the decoded row address. According to an embodiment, the address decoder 130 may be configured to decode a column address of the received address ADDR. The address decoder 130 may couple the input/output circuit 140 and the memory cell array 110 according to the decoded column address.

For example, the address decoder 130 may include components such as a row decoder, a column decoder and an address buffer.

The input/output circuit 140 may include a plurality of page buffers. The plurality of page buffers may be coupled to the memory cell array 110 through bit lines. During a program operation, data may be stored in selected memory cells according to data stored in the plurality of page buffers.

During a read operation, the data stored in the selected memory cells may be sensed through the bit lines and the sensed data may be stored in the page buffers.

The control logic 150 may control the address decoder 130, the voltage generator 120 and the input/output circuit 140. The control logic 150 may operate in response to a command CMD transferred from an external device. The control logic 150 may control peripheral circuits by generating control signals in response to the command CMD and the address ADDR.

The bad block information 160 as described above with reference to FIG. 1 may be stored in some of the plurality of memory blocks BLK1 to BLKi which are included in the memory cell array 110. A memory block which includes the bad block information 160 may be a system block. The system block may be referred to as a CAM block or an OTP block. When the memory device 100 is booted, the control logic 150 may read the bad block information 160 stored in the system block and provide the read bad block information 160 to the memory controller 200 in response to the command of the memory controller as described with reference to FIG. 1. FIG. 2 illustrates that the memory device 100 includes one plane. According to various embodiments, the memory device 100 may include a plurality of planes. A plane may be a unit for independently performing a program operation, a read operation, or an erase operation. When the memory device 100 includes a plurality of planes, each plane may include some or all of the memory cell array 110, the voltage generator 120, the address decoder 130, the input/output circuit 140 and the control logic 150. According to an embodiment, the number of planes may be one of two, four, and eight.

Figure 3:
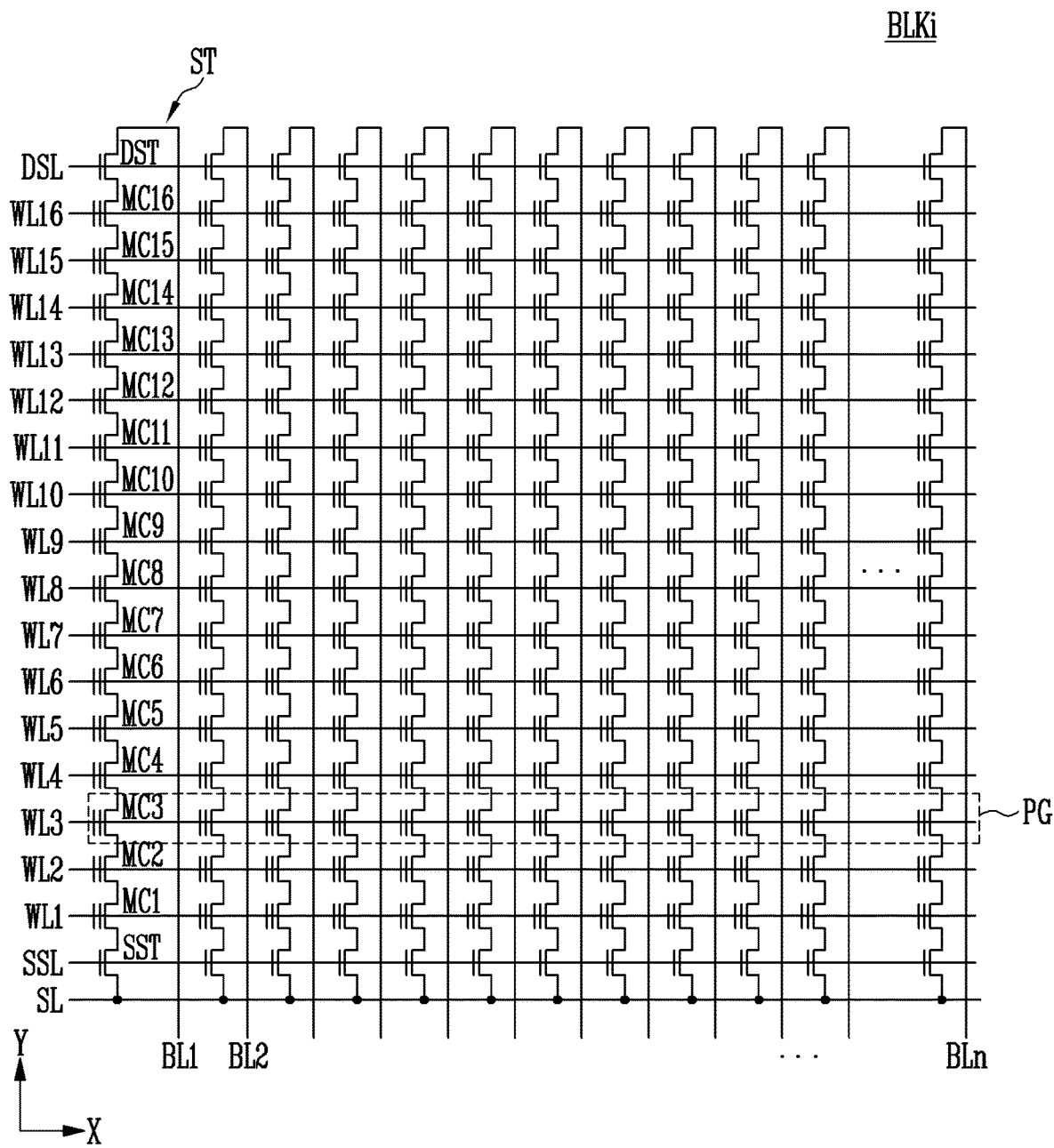
FIG. 3 is a diagram illustrating a structure of a memory block of FIG. 2 according to an embodiment of the present disclosure.

FIG. 3 is a diagram illustrating the structure of a memory block of FIG. 2 according to an embodiment of the present disclosure.

The memory block BLKi corresponding to one of the memory blocks BLK1 to BLKi of FIG. 2 may be shown.

Referring to FIG. 3, the memory block BLKi may be coupled to a plurality of word lines that are arranged in parallel between a first select line and a second select line. The first select line may be a source select line SSL, and the second select line may be a drain select line DSL. More specifically, the memory block BLKi may include a plurality of strings ST that are coupled between bit lines BL1 to BLn and a source line SL. The bit lines BL1 to BLn may be coupled to the strings ST, respectively, and the source line SL may be commonly coupled to the strings ST. The strings ST may have the same configuration. Thus, the string ST coupled to the first bit line BL1 will be described in detail as an example.

The string ST may include a source select transistor SST, a plurality of memory cells MC1 to MC16, and a drain select transistor DST which are coupled in series to each other between the source line SL and the first bit line BL1. Each string ST may include at least one source select transistor SST, at least one drain select transistor DST, and more memory cells than the memory cells MC1 to MC16 shown in FIG. 3.

A source of the source select transistor SST may be coupled to the source line SL and a drain of the drain select transistor DST may be coupled to the first bit line BL1. The memory cells MC1 to MC16 may be coupled in series between the source select transistor SST and the drain select transistor DST.

Gates of the source select transistors SST included in different strings ST may be coupled to the source select line SSL, gates of the drain select transistors DST may be coupled to the drain select line DSL, and gates of the memory cells MC1 to MC16 may be coupled to a plurality of word lines WL1 to WL16. A group of memory cells coupled to the same word line, among memory cells included in different strings ST, may constitute one physical page PG. Therefore, the memory block BLKi may include as many physical pages PG as the number of word lines WL1 to WL16.

A single memory cell may store one bit of data. This memory cell is generally called a single level cell (SLC). One physical page PG may store one logical page (LPG) data. One LPG data may include as many data bits as the number of cells included in one physical page PG.

One memory cell may store two or more bits of data. One physical page PG may store data corresponding to two or more logical pages LPG.

Figure 4:
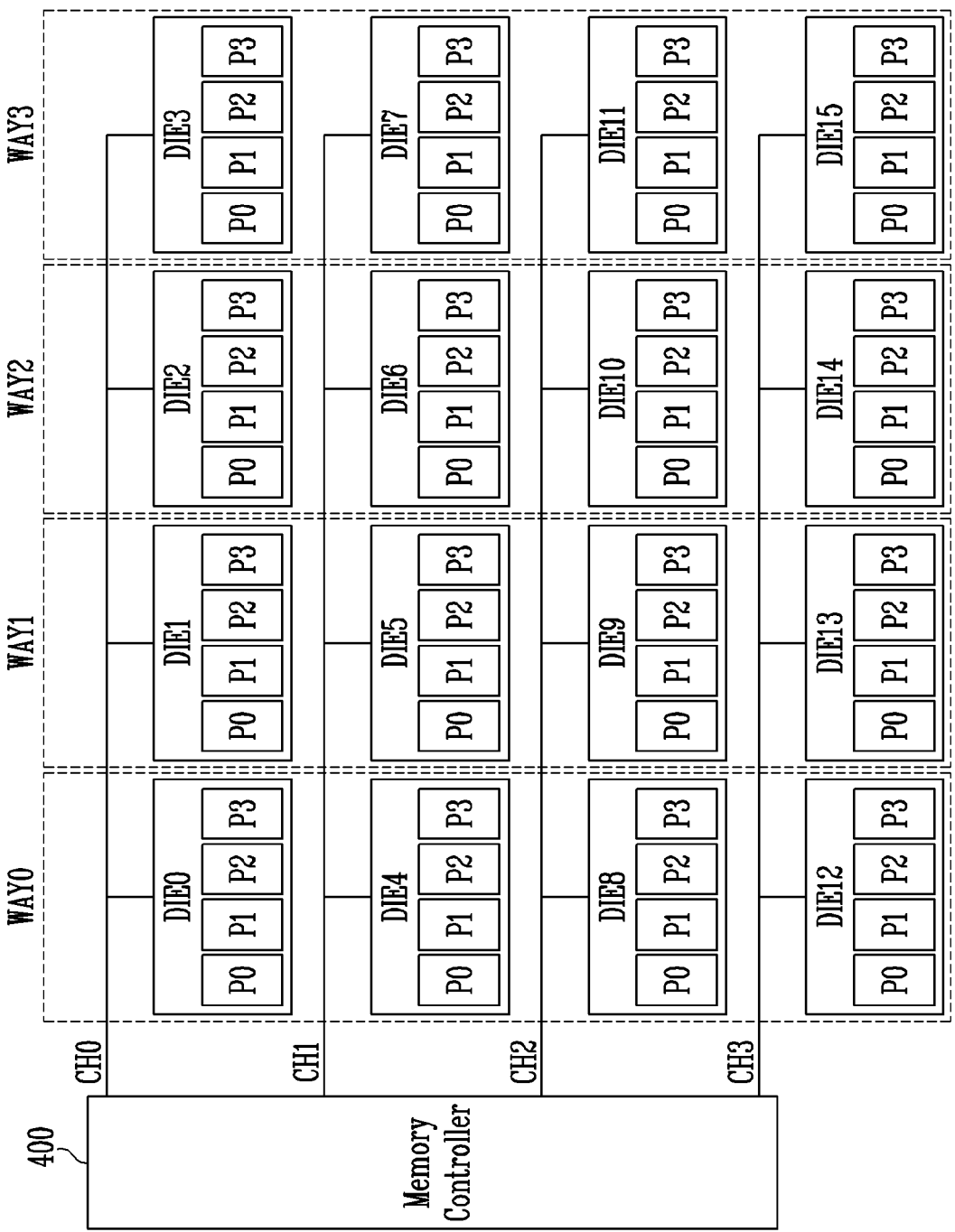
FIG. 4 is a diagram illustrating operations of a plurality of memory devices each including a plurality of planes and a memory controller controlling the same according to an embodiment of the present disclosure.

FIG. 4 is a diagram illustrating operations of a plurality of memory devices each of which includes a plurality of planes and a memory controller controlling the same according to an embodiment of the present disclosure.

Referring to FIG. 4, a memory controller 400 may control a memory die0 DIE0 to a memory die15 DIE15. Each of the memory dies may have the same configuration as the memory device 100 as described above with reference to FIG. 2. As shown in FIG. 4, each of the memory dies may include four planes.

Each of the four planes may include a plurality of memory blocks. One memory block may be configured and operated in the same manner as the memory block BLKi as described above with reference to FIG. 3.

The memory controller 400 may communicate with memory dies using a plurality of channels.

For example, the memory controller 400 may communicate with the memory die0 DIE0 to the memory die15 DIE15 through a channel0 CH0 to a channel3 CH3.

The memory die0 DIE0 to a memory die3 DIE3 may transfer commands, addresses, and data from the memory controller 400 through the channel0 CH0. The memory die0 DIE0 to the memory die3 DIE3 may transfer data to the memory controller 400 through the channel0 CH0.

A memory die4 DIE4 to a memory die7 DIE7 may transfer commands, addresses, and data from the memory controller 400 through a channel1 CH1. The memory die4 DIE4 to the memory die7 DIE7 may transfer data to the memory controller 400 through the channel1 CH1.

A memory die8 DIE8 to a memory die11 DIE11 may transfer commands, address, and data from the memory controller 400 through a channel2 CH2. The memory die8 DIE8 to the memory die11 DIE11 may transfer data to the memory controller 400 through the channel2 CH2.

A memory die12 DIE12 to the memory die15 DIE15 may transfer commands, addresses, and data from the memory controller 400 through the channel3 CH3. The memory die12 DIE12 to the memory die15 DIE15 may transfer data to the memory controller 400 through the channel3 CH3.

The memory die0 DIE0 to the memory die15 DIE15 may be divided into a plurality of ways WAY0 to WAY3. More specifically, the memory die0 DIE0, the memory die4 DIE4, the memory die8 DIE8, and the memory die12 DIE12 may constitute a way0 WAY0. The memory die1 DIE1, a memory die5 DIE5, a memory die9 DIE9, and a memory die13 DIE13 may constitute a way1 WAY1. A memory diet DIE2, a memory die6 DIE6, a memory die10 DIE10, and a memory die14 DIE14 may constitute a way2 WAY2. The memory die3 DIE3, the memory die7 DIE7, the memory die11 DIE11, and the memory die15 DIE15 may constitute the way3 WAY3.

Each of the memory die0 DIE0 to the memory die15 DIE15 may include four planes P0 to P3. While one of the dies coupled to the same channel communicates with the memory controller 400, the other dies cannot communicate with the memory controller 400. In addition, while any of the planes included in one die communicates with the memory controller 400, the other planes within the die including the plane in communication with the memory controller 400, as well as the other dies connected to the same channel, cannot communicate with the memory controller 400. To achieve the best performance using a small number of channels as described above, the memory controller 400 may communicate with the memory die0 DIE0 to the memory die15 DIE15 using an interleaving scheme.

For example, after commands, addresses and data are provided through the channel0 CH0, the commands, the addresses and the data may be provided to a memory die1 DIE1 through the channel0 CH0. While the commands, the addresses and the data are provided to the memory die1 DIE1, the memory die0 DIE0 may perform an internal operation corresponding to the previously received command. In this manner, only one memory die among the memory die0 DIE0 to the memory die3 DIE3 which are coupled to the channel0 CH0 may communicate with the memory controller 400. However, at least some periods of internal operations may overlap each other. This is referred to as a die interleaving scheme. In other words, according to an interleaving scheme, the memory controller 400 may control the memory dies so that internal operations of dies and planes coupled to the same channel may be performed at the same time during at least a portion of a period. Controlling the memory dies according to an interleaving scheme in units of the memory dies may be referred to as "die interleaving" or "way interleaving." By extending an interleaving scheme in units of planes in a memory die, memory dies may be controlled in a plane interleaving scheme. In FIG. 4, for example, the four planes P0 to P3 included in each of the memory die0 DIE0 to the memory die3 DIE3 which are coupled to the channel0 CH0 may be operated according to an interleaving scheme. Therefore, the memory controller 400 may control a maximum of 16 planes to simultaneously perform internal operations during at least a portion of a period.

Figure 5:
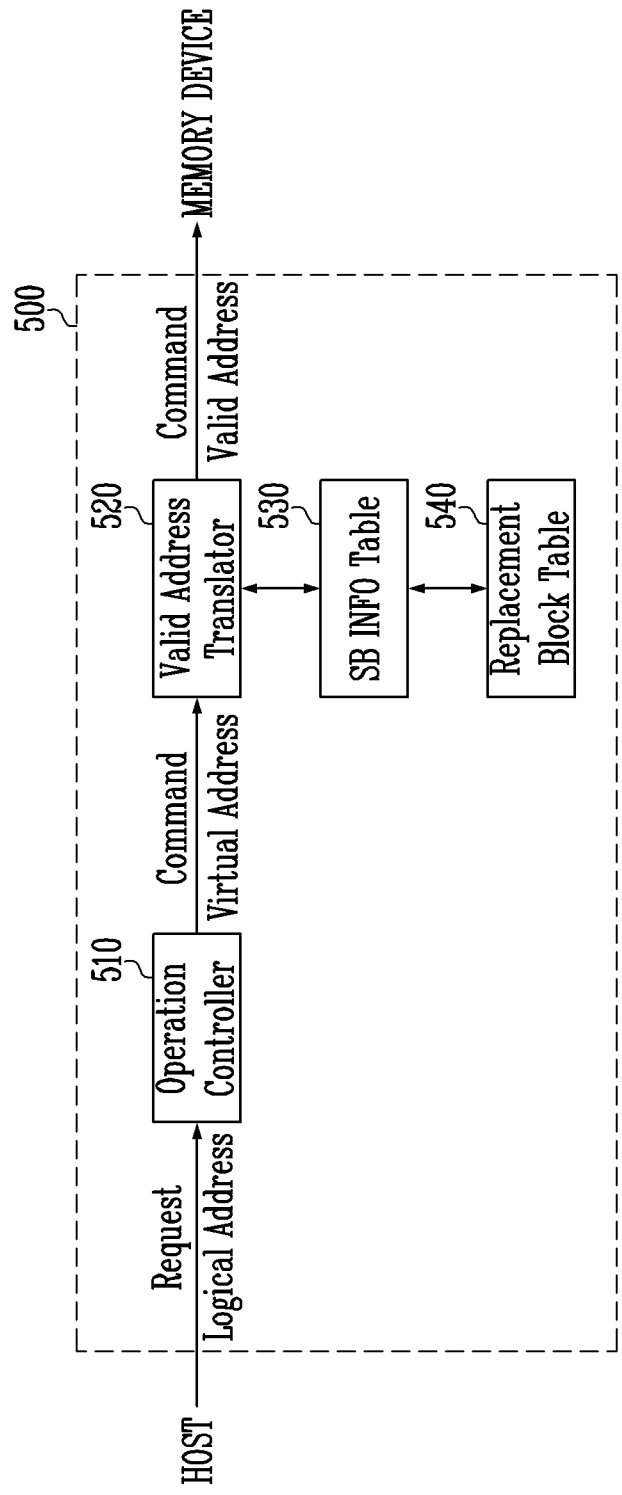
FIG. 5 is a block diagram illustrating operations of a conventional memory controller.

FIG. 5 is a diagram illustrating operations of a conventional memory controller 500.

Referring to FIG. 5, the memory controller 500 may include an operation controller 510, a valid address translator 520, a super block information table 530 and a replacement block table 540.

The operation controller 510 may control the general operations of the memory controller 500. The operation controller 510 may receive a request and a logical address corresponding to the request from a host. As illustrated in FIG. 5, the operation controller 510 may process the request received from the host. However, according to an embodiment, the request which is processed by the operation controller 510 may be generated by an internal operation of the memory controller 500, for example, garbage collection, read reclaim, and wear leveling. The operation controller 510 may generate a command corresponding to the received request. The received request may be a write request or a read request. The generated command may be a program command or a read command to be performed by a memory device. The operation controller 510 may convert a logical address into a virtual address. The virtual address may be allocated without considering a bad block of the memory device, i.e., on the assumption that a bad block is not included in the memory device.

The operation controller 510 may provide the valid address translator 520 with the generated command and the virtual address.

The valid address translator 520 may receive the command and the virtual address from the operation controller 510. The valid address translator 520 may translate the virtual address into a valid address and provide the command and the valid address to the memory device.

The valid address may reflect the bad block which is included in the memory device. In other words, the valid address may refer to an address of a normal block (replacement block) for replacing an address for the bad block included in the virtual address.

In the embodiment of FIG. 5, the valid address translator 520 may translate a virtual address into a valid address with reference to the super block information table 530 and the replacement block table 540.

The super block information table 530 may include information about a super block. The super block information table 530 may contain information indicating whether super blocks included in the memory device are normal super blocks, bad super blocks, or victim super blocks. A normal super block may refer to a super block which does not include a bad block. In other words, the normal super block may be a super block that consists of only normal blocks. A bad super block may refer to a super block that includes at least one bad block. A victim super block may refer to a super block that includes a normal block that is designated to replace a bad block included in a bad super block. According to an embodiment, a victim super block may include at least one bad block. Among bad super blocks, a bad super block may be designated as a victim super block to replace a bad block of another bad super block with a normal block thereof.

The valid address translator 520 may output the virtual address as a valid address when the super block indicated by the virtual address is a normal super block with reference to a super block information table.

When the super block indicated by the virtual address is a bad super block, the valid address translator 520 may replace the virtual address indicating the bad block included in the bad super block with a valid address indicating a normal block included in a victim super block with reference to the super block information table and the replacement block table 540. In other words, the valid address translator 520 may output a valid address for replacing a virtual address of the bad block included in the bad super block with the valid address indicating one of replacement blocks which are normal blocks included in a victim super block.

FIG. 6 is a diagram illustrating bad block information stored in each of a plurality of memory dies.

Referring to FIGS. 4 and 6, bad block information may indicate locations of bad blocks that are included in the four memory dies coupled to the channel0 CH0.

Each of the memory dies coupled to the channel0 CH0 includes the four planes P0 to P3. A super block0 SB0 may include memory blocks #0 of the planes P0 to P3 included in each of the memory dies. A super block1 SB1 may include memory blocks #1 of the planes P0 to P3 included in each of the memory dies. In the same manner, the memory controller 400 may manage and access memory blocks included in memory dies in units of super blocks.

Referring to the bad block information as shown in FIG. 6, a memory block #3 of a plane1 P1 of a memory die0 DIE0 among memory blocks included in a super block3 SB3, a memory block #4 of a planet P2 of a memory die3 DIE3 among memory blocks included in a super block4 SB4, a memory block #6 of a plane3 P3 of a memory die0 DIE0 among memory blocks included in a super block6 SB6, a memory block #7 of a planet P2 of a memory die3 DIE3 among memory blocks included in a super block7 SB7, a memory block #10 of a plane3 P3 of a memory die3 DIE3 among memory blocks included in a super block10 SB10, a memory block #14 of a plane0 P0 of a memory die3 DIE3 among memory blocks included in a super block14 SB14, a memory block #16 of a plane1 P1 of a memory die0 DIE0 among memory blocks included in a super block16 SB16, a memory block #17 of a plane0 P0 of a memory die1 DIE1 among memory blocks included in a super block17 SB17, a memory block #20 of a plane0 P0 of a memory die0 DIE0 among memory blocks included in a super block20 SB20, a memory block #21 of a plane3 P3 of a memory die3 DIE3 among memory blocks included in a super block21 SB21, a memory block #22 of a planet P2 of a memory die1 DIE1 among memory blocks included in a super block22 SB22, a memory block #24 of a plane1 P1 of a memory die0 DIE0 among memory blocks included in a super block24 SB24, and a memory block #26 of a plane1 P1 of the memory die0 DIE0 and a memory block #26 of a plane1 P1 of a memory die3 DIE3 among memory blocks included in a super block26 SB26 may be bad blocks.

A victim super block may be determined based on a plane which includes the largest number of bad blocks among the planes included in each of the memory dies. More specifically, a victim super block may be a super block which includes a bad block in a plane that includes the largest number of bad blocks. In FIG. 6, the plane1 P1 of the memory die0 DIE0 may include the largest number of bad blocks, and the super blocks including the memory blocks #3, #16, #24 and #26 corresponding to the bad blocks included in the plane1 P1 of the memory die0 DIE0 may be victim super blocks.

FIG. 7 is a diagram illustrating the super block information table 530 of FIG. 5.

Referring to FIGS. 5 to 7, the super block information table 530 may include super block numbers (SB #) and status information (Status INFO) of the respective super blocks. The status information (Status INFO) of the super blocks may indicate whether each of the super blocks is a paired super block (Paired), an unpaired super block (Unpaired), or a victim super block (Victim). Referring to the bad block information of FIG. 6, the super blocks SB #3, 16, 24, and 26 may be victim super blocks, and the super blocks SB #4, 6, 7, 10, 14, 17, 20, 21, and 22 which include bad blocks, among the super blocks except for the victim super blocks, may be bad super blocks. The other super blocks, except for the victim super blocks and the bad super blocks, may be normal super blocks.

The valid address translator 520 as described with reference to FIG. 5 may translate a virtual address into a valid address according to status information of a super block which is indicated by the virtual address with reference to the super block information table 530. For example, the valid address translator 520 may output an address which is the same as the virtual address as a valid address when the super block indicated by the virtual address is a normal super block. On the other hand, when the super block indicated by the virtual address is a bad super block, the valid address translator 520 may translate the virtual address into a valid address with reference to the replacement block table 540 to be described below with reference to FIG. 8.

FIG. 8 is a diagram illustrating the replacement block table 540 of FIG. 5.

Referring to FIGS. 5 to 8, the replacement block table 540 may include information about victim super blocks and bad super blocks included in each memory die. Referring to the super block information table 530, when a super block indicated by a virtual address is a bad super block, the valid address translator 520 may replace an address of a bad block included in the super block indicated by the virtual address with an address of a normal block included in a victim super block with reference to the replacement block table 540.

For example, when the super block indicated by the virtual address is the super block20, the valid address translator 520 may identify that the super block20 is a bad super block with reference to the super block information table 530, search the replacement block table 540 for a normal block to replace a bad block included in the bad super block20, and obtain a victim super block (e.g., a victim super block3) including the normal block. However, according to the above method, the entire replacement block table 540 may be searched whenever an operation with respect to the bad super block is performed, which may hinder quick processing of the operation.

Figure 9:
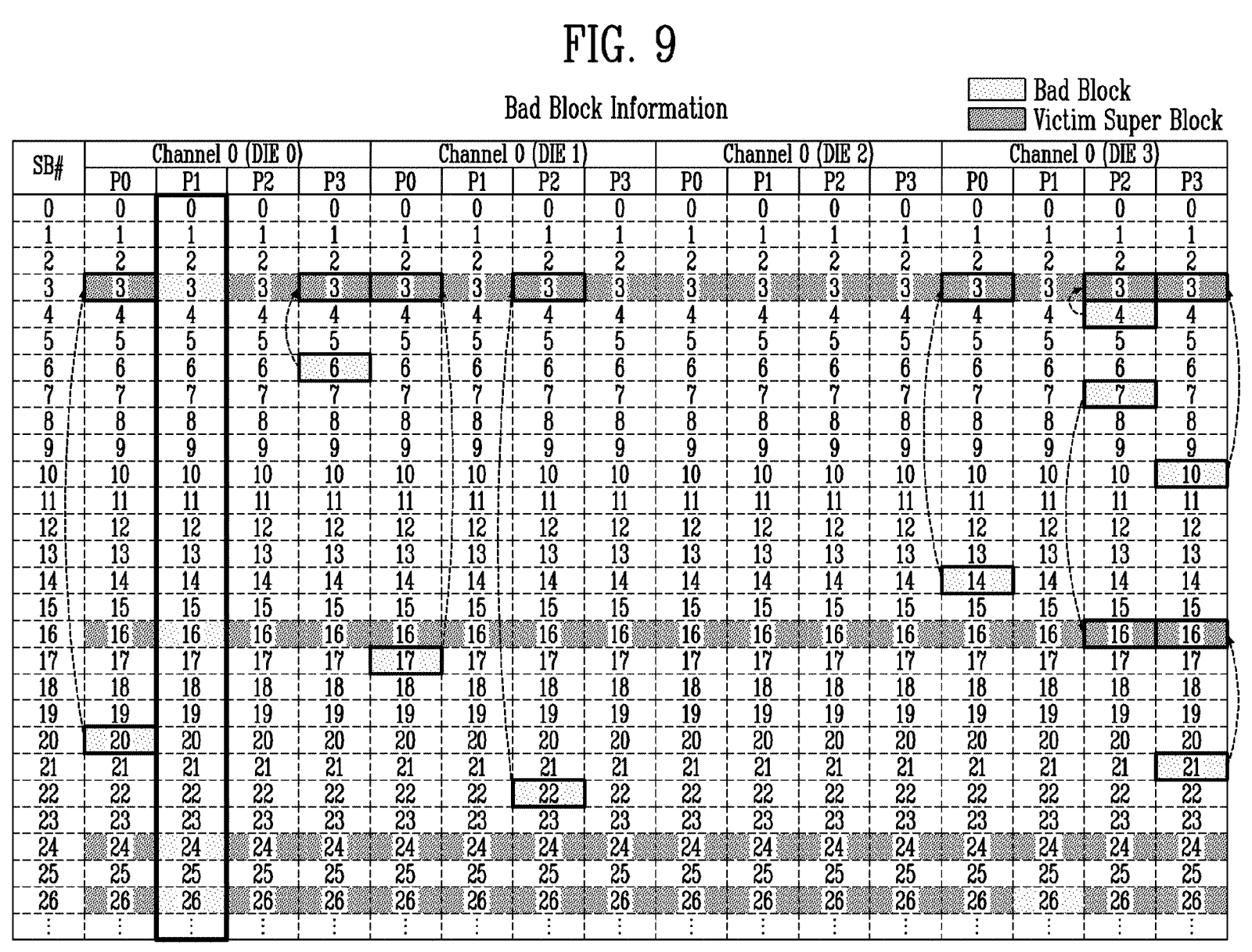

FIG. 9 is a diagram illustrating a method of replacing a bad block with a normal block with reference to the replacement block table 540 of FIG. 8 according to an embodiment of the present disclosure.

Referring to FIGS. 8 and 9, the memory block #20 of the plane0 P0 of the memory die0 DIE0 which is a bad block included in the super block20 may be replaced by the memory block #3 of the plane0 P0 of the memory die0 DIE0 which is a normal block included in the super block3 among the victim super blocks.

In the same manner, the memory block #6 of the plane3 P3 of the memory die0 DIE0 which is a bad block included in the super block6 may be replaced by the memory block #3 of the plane3 P3 of the memory die0 DIE0 which is a normal block included in the super block3 among the victim super blocks. In other words, a bad block included in a bad super block may be replaced by a normal block which is included in the same memory die and the same plane within a victim super block to replace the bad block.

Figure 10:
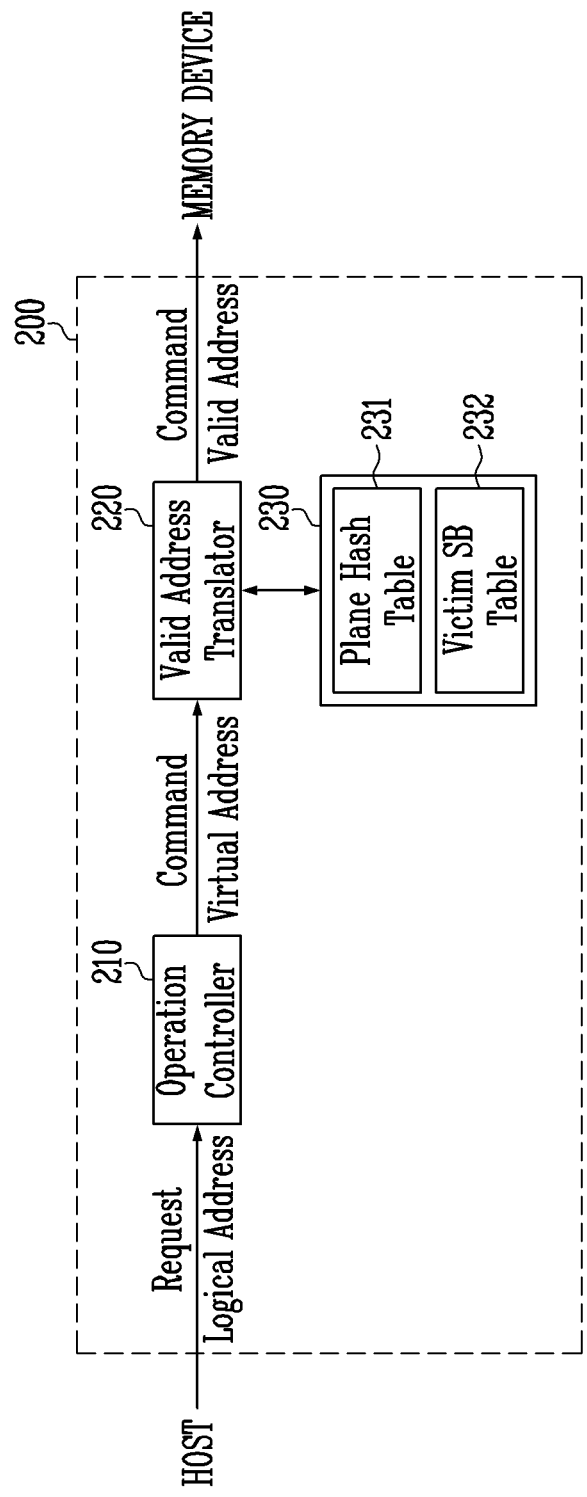
FIG. 10 is a block diagram illustrating operations of a memory controller according to an embodiment of the present disclosure.

FIG. 10 is a diagram illustrating operations of the memory controller 200 according to an embodiment of the present disclosure.

Referring to FIG. 10, the memory controller 200 may include the operation controller 210, the valid address translator 220 and the valid address information storage 230.

The operation controller 210 may control the general operations of the memory controller 200. The operation controller 210 may receive a request and a logical address corresponding to the request from a host. As illustrated in FIG. 10, the operation controller 210 may process the request received from the host. However, according to an embodiment, the request which is processed by the operation controller 210 may be generated through an internal operation of the memory controller 200, for example, garbage collection, read reclaim, and wear leveling. The operation controller 210 may generate a command corresponding to the received request. The received request may be a write request or a read request. In addition, the generated command may be a program command or a read command to be performed by a memory device. The operation controller 210 may convert a logical address into a virtual address. The virtual address may be allocated without considering a bad block of the memory device, i.e., on the basis that the bad block is not included in the memory device.

The operation controller 210 may provide the valid address translator 220 with the generated command and the virtual address.

The valid address translator 220 may receive the command and the virtual address from the operation controller 210. The valid address translator 220 may translate the virtual address into a valid address and provide the command and the valid address to the memory device.

The valid address may reflect the bad block which is included in the memory device. In other words, the valid address may refer to an address indicating a normal block (replacement block) which replaces an address of the bad block included in the virtual address.

The valid address translator 220 may translate a virtual address into a valid address with reference to a plane hash table 231 and a victim super block table 232 stored in the valid address information storage 230.

According to an embodiment, when power is input to the memory controller 200 and the memory device, the valid address translator 220 may receive bad block information from the memory device. The valid address translator 220 may generate the plane hash table 231 and the victim super block table 232 using the received bad block information. The valid address translator 220 may store the plane hash table 231 and the victim super block table 232 in the valid address information storage 230.

According to various embodiments, the valid address information storage 230 may further include the super block information table 530 as described above with reference to FIG. 7.

Figure 11:
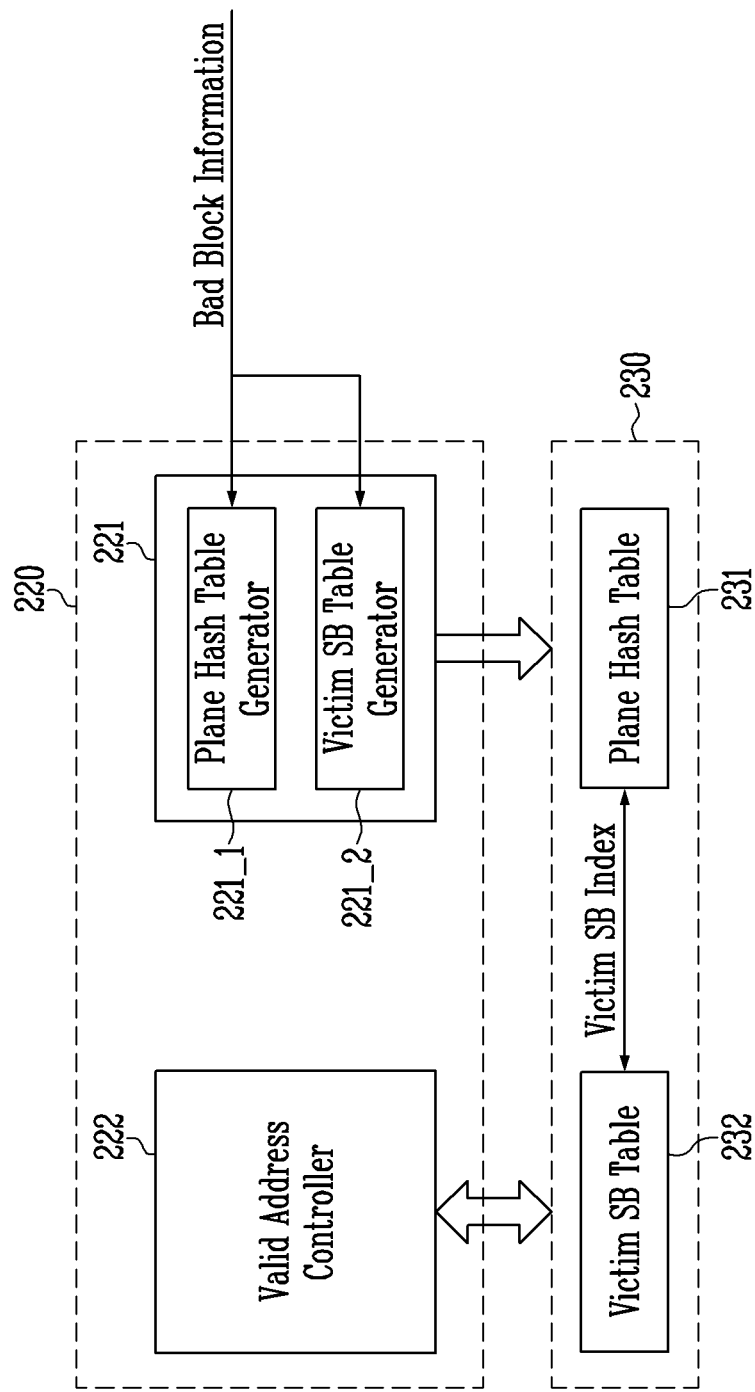
FIG. 11 is a block diagram illustrating operations of a valid address translator and a valid address information storage of FIG. 10 according to an embodiment of the present disclosure.

FIG. 11 is a block diagram illustrating operations of the valid address translator 220 and the valid address information storage 230 of FIG. 10 according to an embodiment of the present disclosure.

Referring to FIG. 11, the valid address translator 220 may include a valid address information generator 221 and a valid address controller 222.

The valid address information generator 221 may receive bad block information from a memory device when the memory controller 200 is booted, and may generate valid address information on the basis of the bad block information.

The valid address information generator 221 may include a plane hash table generator 221_1 and a victim super block table generator 221_2.

The plane hash table generator 221_1 may generate the plane hash table 231 that includes bad super blocks included in each of a plurality of planes included in memory dies on the basis of the bad block information. The number of plane hash tables 231 may be equal to the number of planes. The plane hash table 231 may include the bad super block numbers included in a corresponding one of the planes and victim super block indices corresponding to the bad super blocks. The plane hash table 231 may be generated using a predetermined hash function. When the plane hash table 231 is generated using the hash function, the super block numbers may be mapped to values included in the hash function.

The victim super block table generator 221_2 may determine victim super blocks on the basis of the bad block information and generate the victim super block table 232 in which victim super block indices are allocated to the victim super blocks. A victim super block index may be allocated on the basis of a victim super block having a normal block to replace a bad block in a bad super block.

The victim super block table 232 may be referred to by the bad super block numbers and the victim super block indices included in the plane hash table 231.

The valid address controller 222 may convert a virtual address into a valid address on the basis of the valid address information generated by the valid address information generator 221, and may transfer the generated valid address to the memory device.

Figure 12:
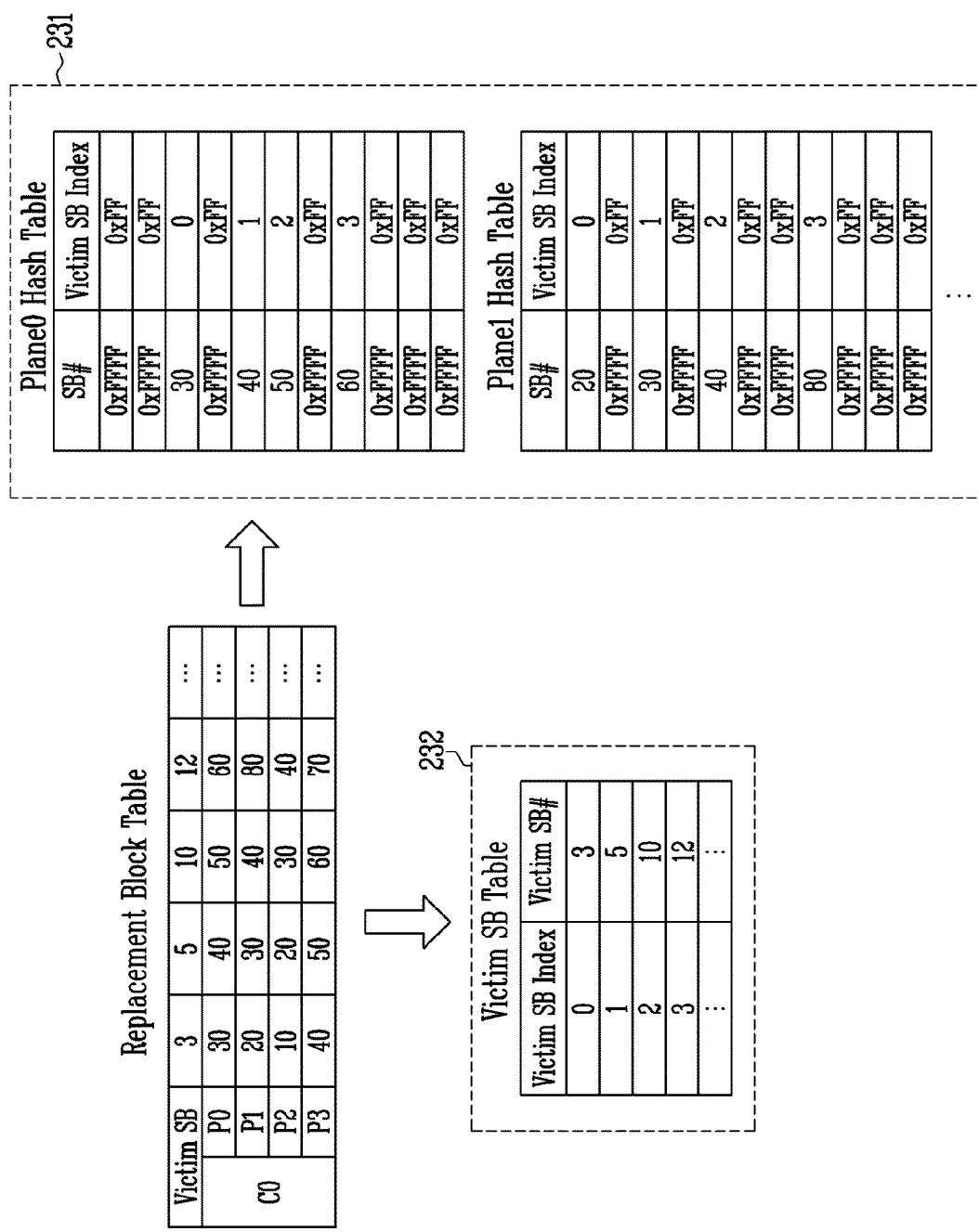
FIG. 12 is a diagram illustrating a plane hash table and a victim super block table of FIG. 10 according to an embodiment of the present disclosure.

FIG. 12 is a diagram illustrating the plane hash table 231 and the victim super block table 232 of FIG. 10 according to an embodiment of the present disclosure.

Referring to FIG. 12, a portion of a replacement block table determined based on bad block information may be shown.

According to a replacement block table as shown in FIG. 12, super blocks 3, 5, 10, and 12 may be victim super blocks, and bad blocks included in planes may be memory blocks #30, #40, #50 and #60 of the plane0 P0, memory blocks #20, #30, #40 and #80 of the plane1 P1, memory blocks #10, #20, #30 and #40 of the planet P2, and memory blocks #40, #50, #60, and #70 of the plane3 P3. For convenience of description, the plane hash table 231 and the victim super block table 232 are described using the replacement block table with reference to FIG. 12. However, as described above with reference to FIG. 11, the plane hash table 231 and the victim super block table 232 may be generated based on the bad block information.

Referring to FIGS. 9 and 12, the memory block #30 of the plane0 P0 included in a super block30 may be replaced by the memory block #3 of the plane0 P0 of the super block3. A memory block #40 of the plane0 P0 included in a super block40 may be replaced by the memory block #5 of the plane0 P0 of a super block5.

Figure 13:
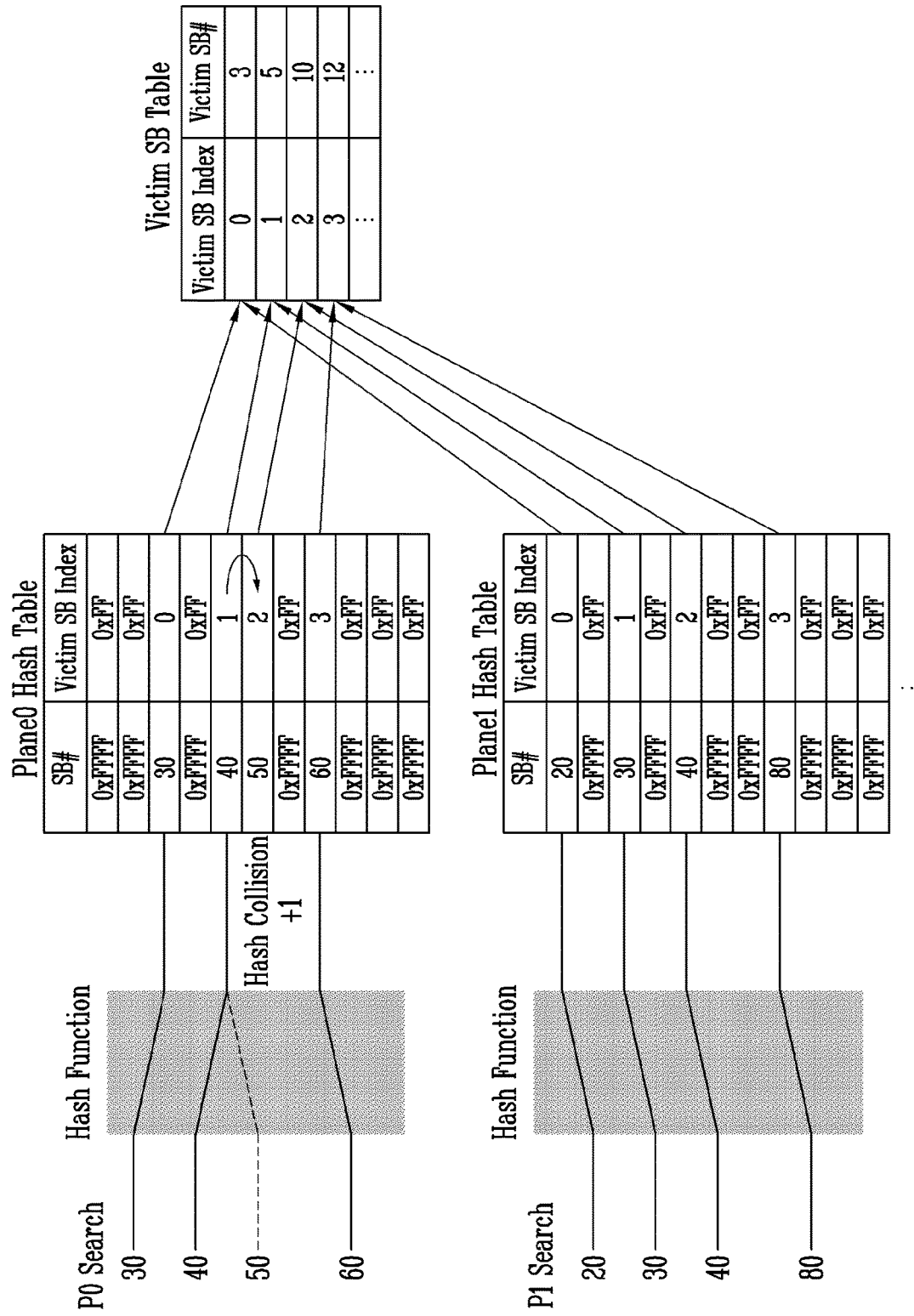
FIG. 13 is a diagram illustrating an address translation operation performed by a valid address translator of FIG. 10 according to an embodiment of the present disclosure.

FIG. 13 is a diagram illustrating an address translation operation performed by the valid address translator 220 of FIG. 10 according to an embodiment of the present disclosure.

Referring to FIGS. 10 and 13, the valid address translator 220 may determine by using a hash function whether a super block number which is indicated by a virtual address is included in the plane hash table 231. When the plane hash table 231 includes a super block number indicated by the virtual address as a result of an operation using the hash function, the valid address translator 220 may determine that it is necessary to replace a bad block included in the super block indicated by the virtual address. The valid address translator 220 may acquire a victim super block index (Victim SB Index) corresponding to the super block number which is present in the plane hash table 231. Hereinafter, the valid address translator 220 may acquire information about a victim super block to replace the bad block with reference to the victim super block table according to the victim super block index. The valid address translator 220 may replace an address of the bad block included in the super block indicated by the virtual address with an address of a replacement block which is a normal block included in the victim super block.

Hereinafter, the super block indicated by the virtual address is the super block30.

The valid address translator 220 may determine by using a hash function whether an address of the super block indicated by the virtual address to be translated exists in the plane hash table 231. The valid address translator 220 may search a hash table Plane0 Hash Table of the plane0 for the super block30 by using the hash function, and may determine that the super block30 exists in the plane hash table 231. From the fact that the super block30 is present in the plane hash table 231, the valid address translator 220 may determine that the super block30 is a bad super block and a memory block included in the plane0 of the super block30 is a bad block. The valid address translator 220 may acquire an index0 which is a victim super block index corresponding to the super block30 of the hash function Plane0 Hash Table of the plane0. The valid address translator 220 may acquire the super block3 which is the victim super block number corresponding to the index0 from the victim super block table.

The valid address translator 220 may replace the memory block #30 which is included in the plane0 of the super block30 with the memory block #3 of the super block3 which is the victim super block. In other words, the valid address translator 220 may acquire a valid address by translating an address of the memory block #30 included in the plane0 of the virtual address into an address of the memory block #3 of the super block3 which is the victim super block.

However, when the virtual address is another super block number other than the super block including the memory blocks #30, #40, #50, and #60 included in the plane0 a value of 0xFFFF may be obtained as a result of searching the hash function Plane0 Hash Table of the plane0 for this. When the super block number indicated by the virtual address is not present in the hash function Plane0 Hash Table of the plane0 it may mean that there is no bad block in the plane0 among the memory blocks included in the super block indicated by a virtual address. When the super block number indicated by the virtual address is not found in the entire plane hash table 231, the super block indicated by the virtual address may be a normal super block.

The valid address translator 220 may search the hash function Plane1 Hash Table of the plane1 for the super block30 by using the hash function. With reference to the hash function Plane1 Hash Table of the plane1, the valid address translator 220 may identify that the memory block #30 in the plane1 is also a bad block, and may acquire an index1 corresponding to a victim super block number. The valid address translator 220 may acquire a valid address for replacing the address of the memory block #30 included in the plane1 of the virtual address by an address of a memory block #5 of the super block5 which is a victim super block.

The process of searching the plane hash table 231 for a super block number indicated by the virtual address by using the hash function will be described below in more details.

A key value of the hash function may be a super block number, i.e., the virtual address. An index corresponding to the key value which is obtained according to the hash function may be a super block number of the plane hash table 231, and mapped data may be a victim super block index.

In the hash table, different key values may have the same index value. This is referred to as a "hash collision." As a result of searching the hash function for a key value of the hash function which corresponds to the super block number indicated by the virtual address, when the searched index value is neither a value of 0xFFFF nor is consistent with its super block number, the valid address translator 220 may search for the super block number corresponding to the virtual address by moving to the next index value according to a linear probing method. For example, each of the super block40 and the super block50 may be mapped to the super block40, which is the same index, on the hash table Plane0 Hash Table of the plane0. When the super block50 is the super block indicated by the virtual address, the searched index value may be neither the value of 0xFFFF nor be consistent with its super block number, the valid address translator 220 may move to the next index value. By the above-described manner, the valid address translator 220 may find that the memory block #50 included in the plane0 of the super block50 is a bad block and a victim super block index corresponding thereto is 2.

The plane hash table generator 221_1 as described above with reference to FIG. 11 may reduce hash collisions by increasing the number of valid index values included in one plane hash table when generating the plane hash table.

Figure 14:
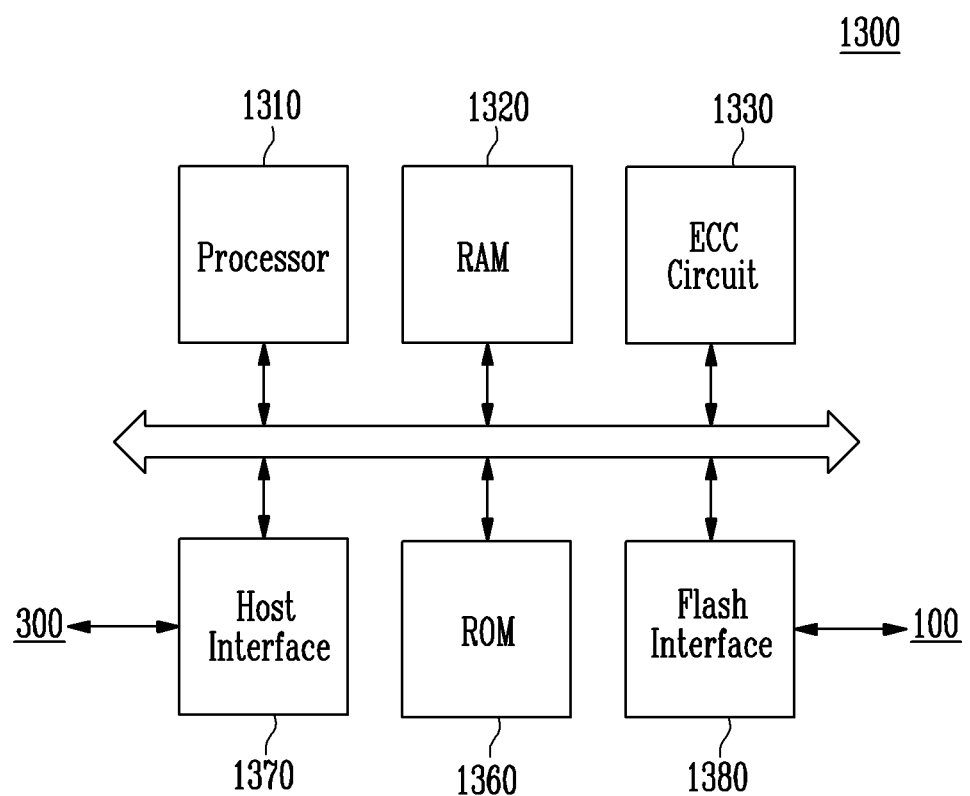
FIG. 14 is a block diagram illustrating another embodiment of a memory controller of FIG. 1 according to an embodiment of the present disclosure.

FIG. 14 is a block diagram illustrating a memory controller 1300 according to another embodiment of the memory controller 200 of FIG. 1 according to an embodiment of the present disclosure.

Referring to FIGS. 1 and 14, the memory controller 1300 may include a processor 1310, a RAM 1320, an ECC circuit 1330, a ROM 1360, a host interface 1370, and a flash interface 1380.

The processor 1310 may control the general operations of the memory controller 1300. The RAM 1320 may serve as a buffer memory, a cache memory, or a working memory of the memory controller 1300.

The ROM 1360 may store various types of information in the form of firmware which is required for the memory controller 1300 to operate.

The memory controller 1300 may communicate with an external device, for example, the host 300 and an application processor, through a host interface 1370.

The memory controller 1300 may communicate with the memory device 100 through the flash interface 1380. The memory controller 1300 may transfer a command CMD, the address ADDR and a control signal CTRL to the memory device 100 or may receive data through the flash interface 1380.

Figure 15:
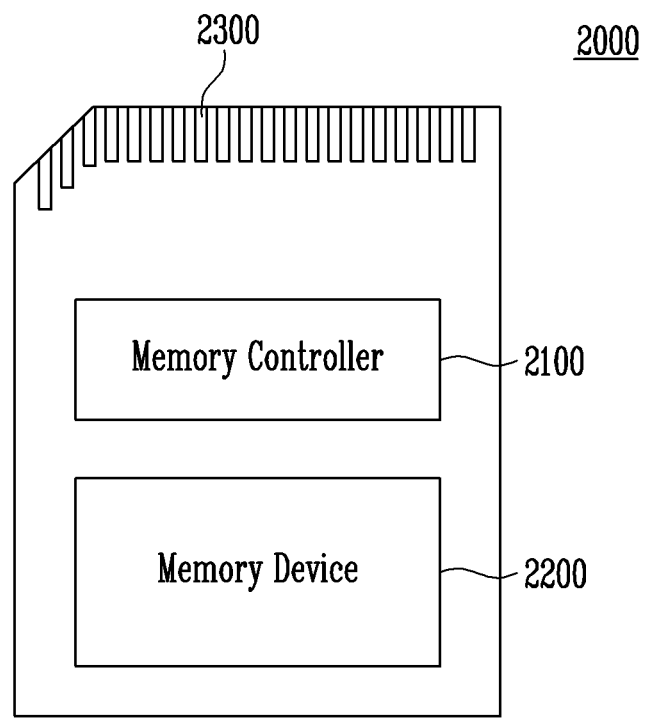
FIG. 15 is a block diagram illustrating an embodiment of a memory card system to which a storage device according to an embodiment of the present disclosure is applied.

FIG. 15 is a block diagram illustrating a memory card system 2000 to which a storage device according to an embodiment of the present disclosure, is applied.

Referring to FIG. 15, the memory card system 2000 may include a memory controller 2100, a memory device 2200, and a connector 2300.

The memory controller 2100 may be coupled to the memory device 2200. The memory controller 2100 may access the memory device 2200. For example, the memory controller 2100 may control read, write, erase, and background operations of the memory device 2200. The memory controller 2100 may be configured to provide an interface between the memory device 2200 and the host. The memory controller 2100 may be configured to drive firmware for controlling the memory device 2200. The memory controller 2100 may have the same configuration as the memory controller 200 described above with reference to FIG. 1.

In an embodiment, the memory controller 2100 may include components, such as a Random Access Memory (RAM), a processing unit, a host interface, a flash interface, and an ECC circuit.

The memory controller 2100 may communicate with an external device through the connector 2300. The memory controller 2100 may communicate with an external device (e.g., host) based on a specific communication protocol. In an embodiment, the memory controller 2100 may communicate with the external device through at least one of various communication standards or interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), WiFi, Bluetooth, and nonvolatile memory express (NVMe) protocols. In an embodiment, the connector 2300 may be defined by at least one of the above-described various communication standards or interfaces.

In an embodiment, the memory device 2200 may be implemented as any of various nonvolatile memory devices, such as an Electrically Erasable and Programmable ROM (EEPROM), a NAND flash memory, a NOR flash memory, a Phase-change RAM (PRAM), a Resistive RAM (Re-RAM), a Ferroelectric RAM (FRAM), a Spin transfer Torque Magnetic RAM (STT-MRAM).

The memory device 2200 and the memory controller 2100 may be integrated into a single semiconductor device to form a memory card. For example, the memory controller 2100 and the memory device 2200 may be integrated into a single semiconductor device and form a memory card, such as a personal computer memory card international association (PCMCIA), a compact flash (CF) card, a smart media card (SM or SMC), a memory stick, a multimedia card (MMC, RS-MMC, or MMCmicro), an SD card (SD, miniSD, microSD, or SDHC), a universal flash storage (UFS), and the like.

Figure 16:
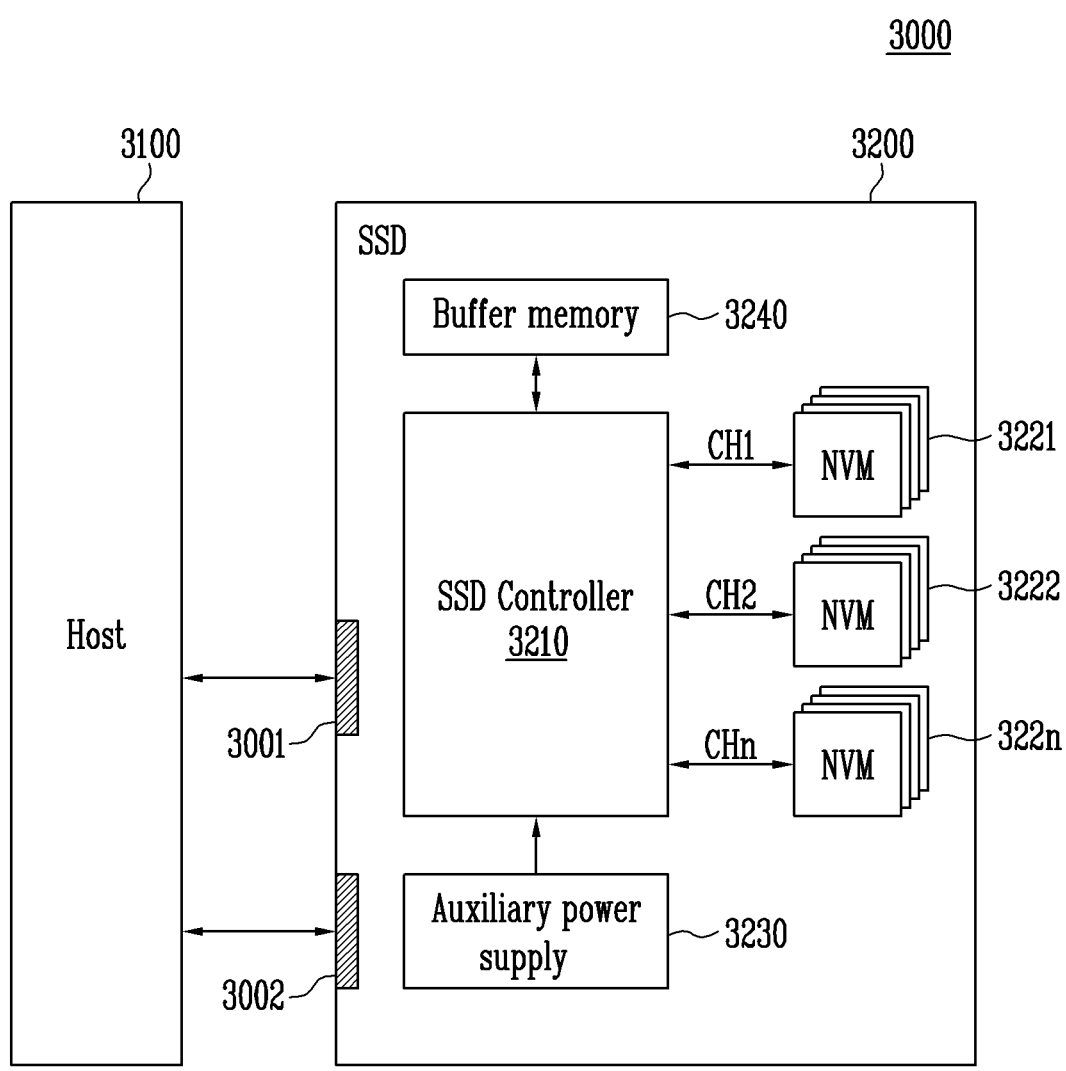
FIG. 16 is a block diagram illustrating a solid state drive (SSD) system to which a storage device according to an embodiment of the present disclosure is applied.

FIG. 16 is a block diagram illustrating a solid state drive (SSD) system 3000 to which a storage device according to an embodiment of the present disclosure is applied.

Referring to FIG. 16, the SSD system 3000 may include a host 3100 and an SSD 3200. The SSD 3200 may exchange signals with the host 3100 through a signal connector 3001 and may receive power through a power connector 3002.

The SSD 3200 may include an SSD controller 3210, a plurality of flash memories 3221 to 322n, an auxiliary power supply 3230, and a buffer memory 3240.

In an embodiment, the SSD controller 3210 may perform the function of the memory controller 200 as described above with reference to FIG. 1.

The SSD controller 3210 may control the plurality of flash memories 3221 to 322n in response to the signals received from the host 3100. In an embodiment, the signals may be based on the interfaces of the host 3100 and the SSD 3200. For example, the signals may be defined by at least one of various communication standards or interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), WiFi, Bluetooth, and nonvolatile memory express (NVMe) interfaces.

The auxiliary power supply 3230 may be coupled to the host 3100 through the power connector 3002. The auxiliary power supply 3230 may be supplied and charged with the power from the host 3100. The auxiliary power supply 3230 may supply the power of the SSD 3200 when power is not smoothly supplied from the host 3100. In an embodiment, the auxiliary power supply 3230 may be positioned inside or outside the SSD 3200. For example, the auxiliary power supply 3230 may be disposed in a main board and may supply auxiliary power to the SSD 3200.

The buffer memory 3240 may operate as a buffer memory of the SSD 3200. For example, the buffer memory 3240 may temporarily store data received from the host 3100 or data received from the plurality of flash memories 3221 to 322n or may temporarily store metadata (e.g., mapping tables) of the flash memories 3221 to 322n. The buffer memory 3240 may include volatile memories such as DRAM, SDRAM, DDR SDRAM, LPDDR SDRAM, and GRAM, or nonvolatile memories such as FRAM, ReRAM, STT-MRAM, and PRAM.

Figure 17:
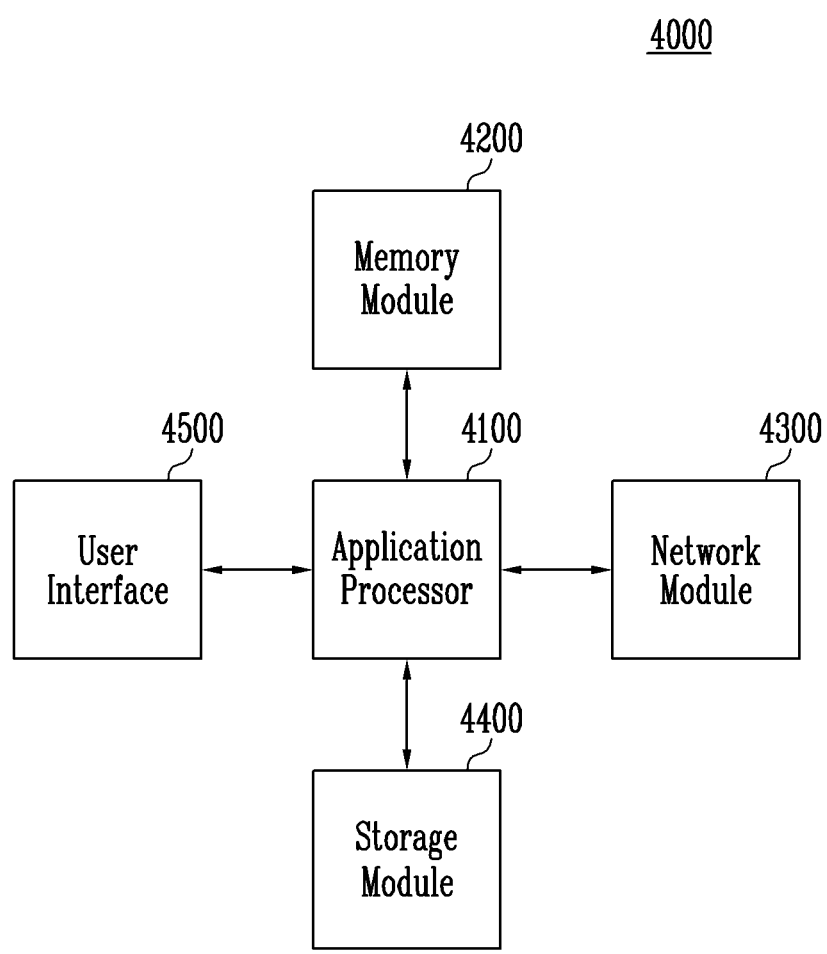
FIG. 17 is a block diagram illustrating a user system to which a storage device according to an embodiment is applied.

FIG. 17 is a block diagram illustrating a user system 4000 to which a storage device according to an embodiment of the present disclosure is applied.

Referring to FIG. 17, the user system 4000 may include an application processor 4100, a memory module 4200, a network module 4300, a storage module 4400, and a user interface 4500.

The application processor 4100 may run components included in the user system 4000, an Operating System (OS), or a user program. In an embodiment, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory or a cache memory of the user system 4000. The memory module 4200 may include volatile RAMs such as DRAM, SDRAM, DDR SDRAM, DDR2 SDRAM, DDR3 SDRAM, LPDDR SDRAM, LPDDR2 SDRAM, and LPDDR3 SDRAM or nonvolatile RAMs such as PRAM, ReRAM, MRAM, and FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), Wimax, WLAN, UWB, Bluetooth, or WiFi communication. In an embodiment, the network module 4300 may be included in the application processor 4100.

The storage module 4400 may store data. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a Phase-change RAM (PRAM), a Magnetic RAM (MRAM), a Resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 4000.

For example, the storage module 4400 may include a plurality of non-volatile memory devices, and the plurality of non-volatile memory devices may operate in the same manner as the memory device 100 described above with reference to FIG. 1. The plurality of non-volatile memory devices may operate in the same manner as the storage device 50 as described above with reference to FIG. 1.

The user interface 4500 may include interfaces which input data or commands to the application processor 4100 or output data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a Liquid Crystal Display (LCD), an Organic Light Emitting Diode (OLED) display device, an Active Matrix OLED (AMOLED) display device, an LED, a speaker, and a monitor.

According to the present disclosure, a storage device including a memory controller acquiring a valid address reflecting a bad block more quickly and a memory device, and a method of operating the storage device may be provided.

In the above-discussed embodiments, all operations may be selectively performed or part of the operations may be skipped. In addition, the operations in each embodiment may not always be performed in regular order. Furthermore, the embodiments disclosed in the present specification and the drawings aim to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure. It will be apparent to those skilled in the art that various modifications can be made to the above-described embodiments of the present disclosure without departing from the spirit or scope of the invention. Thus, it is intended that the present disclosure cover all such modifications provided they come within the scope of the appended claims and their equivalents. Furthermore, the embodiments may be combined to form additional embodiments.

What is claimed is:

1. A memory controller controlling a plurality of memory devices each including a plurality of memory blocks, wherein the plurality of memory blocks are included in each of a plurality of planes, the plurality of memory blocks are controlled in units of super blocks, each super block includes at least two memory blocks, the memory controller comprising:
an operation controller configured to generate a command for controlling the plurality of memory devices and to convert a logical address corresponding to the command into a virtual address for a super block among the super blocks;
plane hash tables, for the plurality of planes respectively, for storing super block indices indicating super blocks which include a bad block among the super blocks and victim super block indices indicating victim super blocks among the super blocks, each of the victim super blocks includes a normal block to replace the bad block;
a victim super block table for storing the victim super block indices corresponding to the victim super blocks among the super blocks; and
a valid address translator configured to search the plane hash tables for a super block index corresponding to the virtual address for the super block by using a hash function, to translate the virtual address into a valid address being a physical address including no bad block according to a search result, and providing the command and the valid address to the plurality of memory devices.

2. The memory controller of claim 1, wherein the victim super blocks include bad blocks included in a plane which includes a largest number of bad blocks among the plurality of planes.

3. The memory controller of claim 1, wherein the valid address is an address of the normal block to replace the bad block included in the super block indicated by the virtual address.

4. The memory controller of claim 1, wherein the valid address translator searches the plane hash tables for the super block index indicated by the virtual address by using the super block index indicated by the virtual address as a key value for the hash function, and translates the virtual address into the valid address according to the search result.

5. The memory controller of claim 4, wherein the valid address translator acquires, among the victim super block indices, a victim super block index corresponding to the super block index indicated by the virtual address from the plane hash tables.

6. The memory controller of claim 5, wherein the valid address translator determines, as the valid address, an address of the normal block included in the victim super block indicated by the victim super block index acquired from the plane hash tables, for replacing an address of the bad block included in the super block indicated by the virtual address.

7. The memory controller of claim 4, wherein the valid address translator provides the virtual address as the valid address when the super block index indicated by the virtual address is not present in the plane hash tables.

8. The memory controller of claim 1, wherein the command for controlling the plurality of memory devices is a program command or a read command.

9. The memory controller of claim 1, wherein the victim super blocks include at least one bad block.

10. The memory controller of claim 1, wherein the plane hash tables and the victim super block table are generated based on bad block information acquired from the memory devices when the memory controller is booted.

11. A memory controller controlling a plurality of memory devices each including a plurality of planes each including a plurality of memory blocks, the memory controller comprising:
a valid address information generator configured to acquire bad block information from the plurality of memory devices, and to generate a plurality of plane hash tables for the plurality of planes and a victim super block table based on the bad block information; and
a valid address controller configured to:
in response to a virtual address of a bad block among the plurality of memory blocks, determine a normal block of a victim super block using the victim super block table and a plane hash table corresponding to the virtual address among the plurality of plane hash tables, and
convert the virtual address of the bad block into a valid address of the normal block.

12. The memory controller of claim 11,
wherein the plurality of memory blocks are controlled in units of super blocks, each super block includes at least two memory blocks, and
wherein the valid address information generator includes a plane hash table generator configured to generate the plurality of plane hash tables based on the bad block information,
wherein each of the plurality of plane hash tables includes bad super block indices representing bad super blocks which include a bad blocks among the plurality of super blocks.

13. The memory controller of claim 12, wherein the valid address information generator further includes a victim super block generator configured to generate the victim super block table including victim super block indices representing victim super blocks which include normal blocks to replace the virtual address of the bad block corresponding to the bad super block indices, respectively.

14. The memory controller of claim 13, further comprising a valid address information storage configured to store the plurality of plane hash tables and the victim super block table.

15. The memory controller of claim 13, wherein the valid address controller is configured to:
determine whether a super block index using a block index of the virtual address as a key value of a hash function is included in the plane hash table corresponding to a plane index of the virtual address, and
when the super block index is included in the plane hash table, convert the virtual address into the valid address.

16. The memory controller of claim 13, wherein when the super block index is included in the plane hash table, the valid address controller is configured to:
determine, among the victim super block indices, a victim super block index corresponding to the super block index indicated by the virtual address from the plane hash table,
determine, from the victim super block table, the victim super block corresponding to the victim super block index,
determine the normal block, among memory blocks included in the victim super block, corresponding to the plane index, and
convert the virtual address of the bad block into the valid address of the normal block.

17. The memory controller of claim 13, wherein the valid address controller provides the virtual address as the valid address when the super block index indicated by the virtual address is not present in the plurality of plane hash tables.

18. A storage device, comprising:
   a plurality of memory devices each including a plurality of planes each including a plurality of memory blocks, wherein the plurality of memory blocks are controlled in units of super blocks, each super block includes at least two memory blocks;
   a valid address information storage including:
   plane hash tables for the plurality of planes respectively, wherein each of the plane hash tables include super block indices representing super blocks including a bad block of the plurality of planes, respectively and a victim super block index indicating a victim super block including a normal block to replace the bad block, and
   a victim super block table including a victim super block index corresponding to the victim super block index; and
   a memory controller configured to:
   receive a request for instructing an operation to be performed and a logical address corresponding to the request from an external host,
   generate a command for the operation in response to the request,
   acquire a virtual address corresponding to the logical address, wherein the virtual address is an address of memory block for the operation,
   search the plane hash tables for the super block number indicated by the virtual address by using a hash function,
   acquire, as a valid address, an address of the normal block included in the victim super block for replacing an address of the bad block included in the super block index indicated by the virtual address, according to a result of the search, and
   provide the command and the valid address to the plurality of memory devices.

19. The storage device of claim 18, wherein the victim super block includes a bad block included in a plane including a largest number of bad blocks among the plurality of planes.

20. The storage device of claim 18, wherein the valid address is an address of the normal block, which is included in the victim super block and is to replace the bad block included in the super block indicated by the virtual address.

* * * * *